(12) United States Patent
Tanaka et al.

(10) Patent No.: US 8,581,674 B2
(45) Date of Patent: Nov. 12, 2013

(54) FILTER AND COMMUNICATIONS APPARATUS

(75) Inventors: Hiroyuki Tanaka, Soraku-gun (JP);
Takehiro Okumichi, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 530 days.

(21) Appl. No.: 12/809,967

(22) PCT Filed: Dec. 26, 2008

(86) PCT No.: PCT/JP2008/073867
§ 371 (c)(1),
(2), (4) Date: Jun. 21, 2010

(87) PCT Pub. No.: WO2009/082012
PCT Pub. Date: Jul. 2, 2009

(65) Prior Publication Data
US 2010/0283555 A1    Nov. 11, 2010

(30) Foreign Application Priority Data

Dec. 26, 2007   (JP) .................................. 2007-334151
Mar. 26, 2008   (JP) .................................. 2008-080550

(51) Int. Cl.
*H03H 9/72*   (2006.01)
*H03H 9/64*   (2006.01)

(52) U.S. Cl.
USPC ......................................... 333/133; 333/195

(58) Field of Classification Search
USPC .......................................... 333/133, 187–196
See application file for complete search history.

(56) References Cited

U.S. PATENT DOCUMENTS

| | | | |
|---|---|---|---|
| 5,521,453 A | 5/1996 | Yatsuda | 310/313 R |
| 5,889,357 A | 3/1999 | Yachi et al. | 310/344 |
| 7,800,461 B2 * | 9/2010 | Terada et al. | 333/175 |
| 2001/0052830 A1 * | 12/2001 | Noguchi et al. | 333/133 |
| 2002/0021192 A1 * | 2/2002 | Klee et al. | 333/187 |
| 2002/0039056 A1 | 4/2002 | Kawachi et al. | 333/193 |
| 2003/0201846 A1 * | 10/2003 | Nakamura et al. | 333/193 |
| 2004/0227586 A1 * | 11/2004 | Taniguchi et al. | 333/133 |
| 2005/0093652 A1 * | 5/2005 | Ma et al. | 333/187 |
| 2008/0218927 A1 * | 9/2008 | Harada et al. | 361/119 |
| 2008/0238567 A1 * | 10/2008 | Rosetti et al. | 333/17.3 |

FOREIGN PATENT DOCUMENTS

| | | |
|---|---|---|
| JP | 06-177697 | 6/1994 |
| JP | 08-288790 | 11/1996 |
| JP | 2000-049565 | 2/2000 |
| JP | 2002-369098 | 12/2002 |
| WO | WO 2007/031051 | * 3/2007 |
| WO | WO 2007/034589 | * 3/2007 |

OTHER PUBLICATIONS

Japanese language office action dated Mar. 21, 2012 and its English language translation issued in corresponding Japanese application 2009547149.

* cited by examiner

*Primary Examiner* — Barbara Summons
(74) *Attorney, Agent, or Firm* — DLA Piper LLP (US)

(57) ABSTRACT

A filter includes a first signal line connected to one input-side unbalanced signal terminal, a second signal line connected to another output-side unbalanced signal terminal, a shunt circuit for providing connection between the first and second signal lines in parallel with a surface acoustic wave device, a first capacitor disposed in the first signal line so as to be in series with respect to the surface acoustic wave device, a first inductor disposed in the shunt circuit at a side of the first signal line, and a series resonance circuit having a second capacitor and a second inductor disposed in the shunt circuit at a side of the second signal line.

10 Claims, 21 Drawing Sheets

FILTER AND COMMUNICATIONS APPARATUS

CROSS-REFERENCE TO THE RELATED APPLICATIONS

This application is a national stage of international application No. PCT/JP2008/073867, filed on Dec. 26, 2008, and claims the benefit of priority under 35 USC 119 to Japanese Patent Application No. 2007-334151, filed on Dec. 26, 2007 and Japanese Patent Application No. 2008-080550, filed on Mar. 26, 2008, the entire contents of which are incorporated herein by reference.

TECHNICAL FIELD

The present invention relates to a filter such as a surface acoustic wave filter for use in a mobile communications apparatus such for example as a cellular phone, and a communications apparatus having the filter.

BACKGROUND ART

A SAW filter utilizing a surface acoustic wave (SAW) has hitherto been in wide use as a frequency selective filter (hereafter also referred to simply as "filter") for use in RF (radio frequency) stage of a mobile communications apparatus such as a cellular phone and an automobile telephone. In general, various characteristics that are required of a frequency selective filter include wide pass band, low loss, and high attenuation.

For example, for the broadening of SAW filter passband range, a SAW filter is used that has a longitudinally coupled resonator-type surface acoustic wave device in which a plurality of IDT (InterDigital Transducer) electrodes are arranged along a surface acoustic wave propagation direction and a reflector electrode is disposed on both sides of the whole of the IDT electrodes.

In order to achieve impedance matching within the range of the pass band of the SAW filter, especially in the case of a wide passband SAW filter, a matching circuit is commonly used. In FIG. 17, there is shown an ideal circuit configuration of a conventional SAW filter 20a having a matching circuit (Conventional example 1). For the impedance matching within the range of the pass band of the SAW filter 20a, a first signal line 9 connected to an input signal terminal 12 in the SAW filter 20a is provided with a first capacitor 35 in series with respect to a surface acoustic wave device 1 and a first inductor 36 in parallel with respect to the surface acoustic wave device 1, and a second signal line 10 connected to an output signal terminal 13 in the SAW filter 20a is provided with a second capacitor 37 in series with respect to the surface acoustic wave device 1 and a second inductor 38 in parallel with respect to the surface acoustic wave device 1. The first inductor 36 and the second inductor 38 are connected to a ground electrode 8.

In FIG. 18, there is shown the result of simulation as to the electrical characteristics (frequency-transmission characteristic relationship) of the SAW filter 20a having the circuit configuration shown in FIG. 17. As electrical characteristics, the SAW filter 20a exhibits wide passband capability with a bandwidth of approximately 100 MHz and is able to effect impedance matching with less ripples.

However, in the SAW filter in a condition of actual service, an ideal circuit configuration such as shown in FIG. 17 cannot be realized. The SAW filter generally operates in a state of being mounted on a dielectric substrate by means of solder. In this case, since wiring, through hole conductors, and so forth are present between a ground electrode of the dielectric substrate and the ground electrode 8 required for electrical evaluation, it follows that an inductance component inevitably arises due to the wiring, through hole conductors, etc. Therefore, in the SAW filter in a condition of actual service, the first inductor 36 and the second inductor 38 are connected to the ground electrode 8 via a parasitic inductance of the dielectric substrate. Due to the presence of such a parasitic inductance, the SAW filter 20a shown in FIG. 17 exhibits in reality an electrical characteristic as shown in FIG. 20 that, in contrast to the electrical characteristic of the ideal circuit configuration shown in FIG. 18, shows a sign of deterioration in attenuation outside the pass band. This is because part of electric current which flowed from the first signal line 9 to the first inductor 36 does not flow into the ground electrode 8 due to the parasitic inductance of the dielectric substrate but flows toward the second inductor 38, which leads to current leakage to the second signal line 10.

DISCLOSURE OF INVENTION

The invention has been completed in view of the above-described problems associated with the conventional art, and accordingly its object is to provide a filter which is capable of attaining a high attenuation outside a pass band while effecting impedance matching in the pass band, as well as a communications apparatus employing the filter.

A filter according to an embodiment of the invention comprises a surface acoustic wave device; an input signal terminal electrically connected to the surface acoustic wave device via a first signal line; an output signal terminal electrically connected to the surface acoustic wave device via a second signal line; a first inductor having its one end connected to the first signal line and having its other end connected to ground via a parasitic inductance; and a series resonance circuit having an output-side capacitor and a second inductor connected in series with the output-side capacitor, the series resonance circuit having its one end connected to the second signal line and having its other end connected to ground via a parasitic inductance.

A communications apparatus according to an embodiment of the invention comprises at least one of a receiving circuit and a transmitting circuit having the filter mentioned above.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Hereinafter, a filter according to the present embodiment will be described in detail with reference to drawings. Note that the filter of the present embodiment is a surface acoustic wave filter (hereafter also referred to as "SAW filter") employing a resonator-type surface acoustic wave device as an acoustic wave device. The size of each electrode, the distance between electrodes, the number of electrode fingers, the spacing between electrode fingers, and so forth are schematically represented for purposes of illustration.

Figure 1:
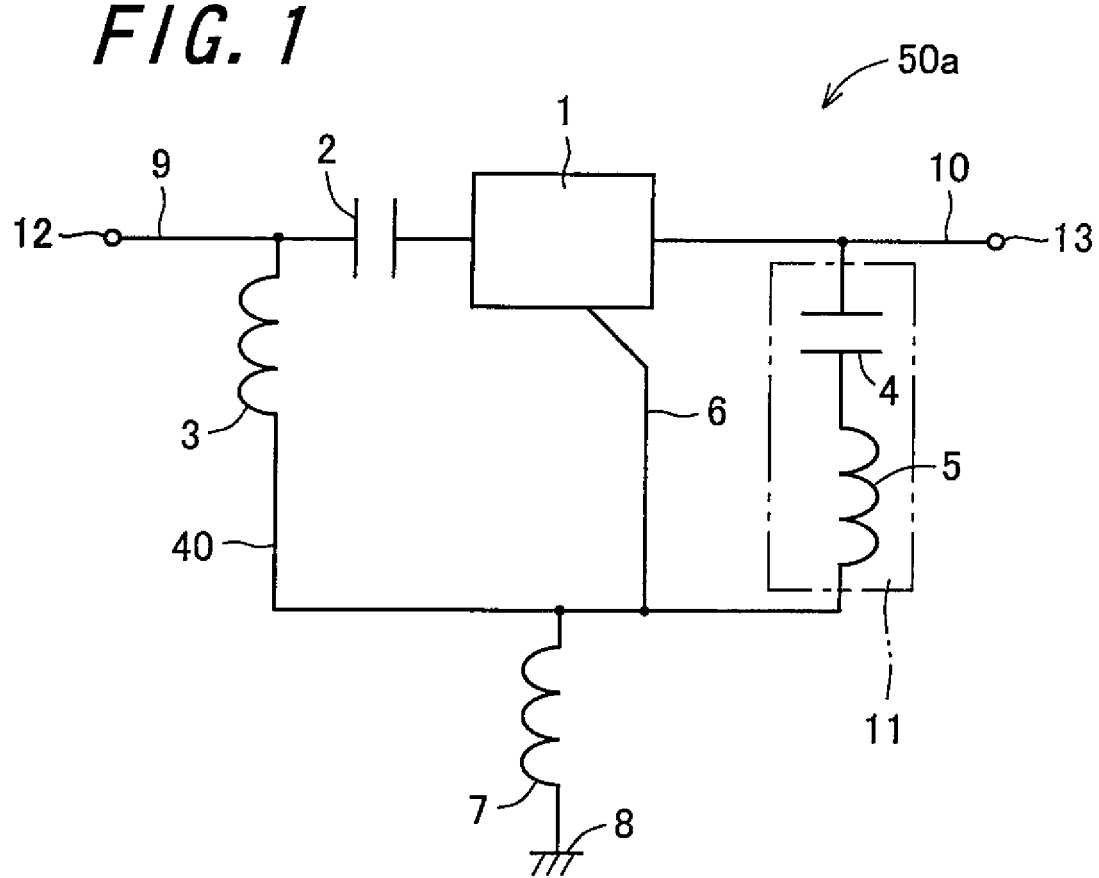
FIG. 1 is a circuit diagram showing one example of the circuit configuration of the filter according to the embodiment.
Figure 2:
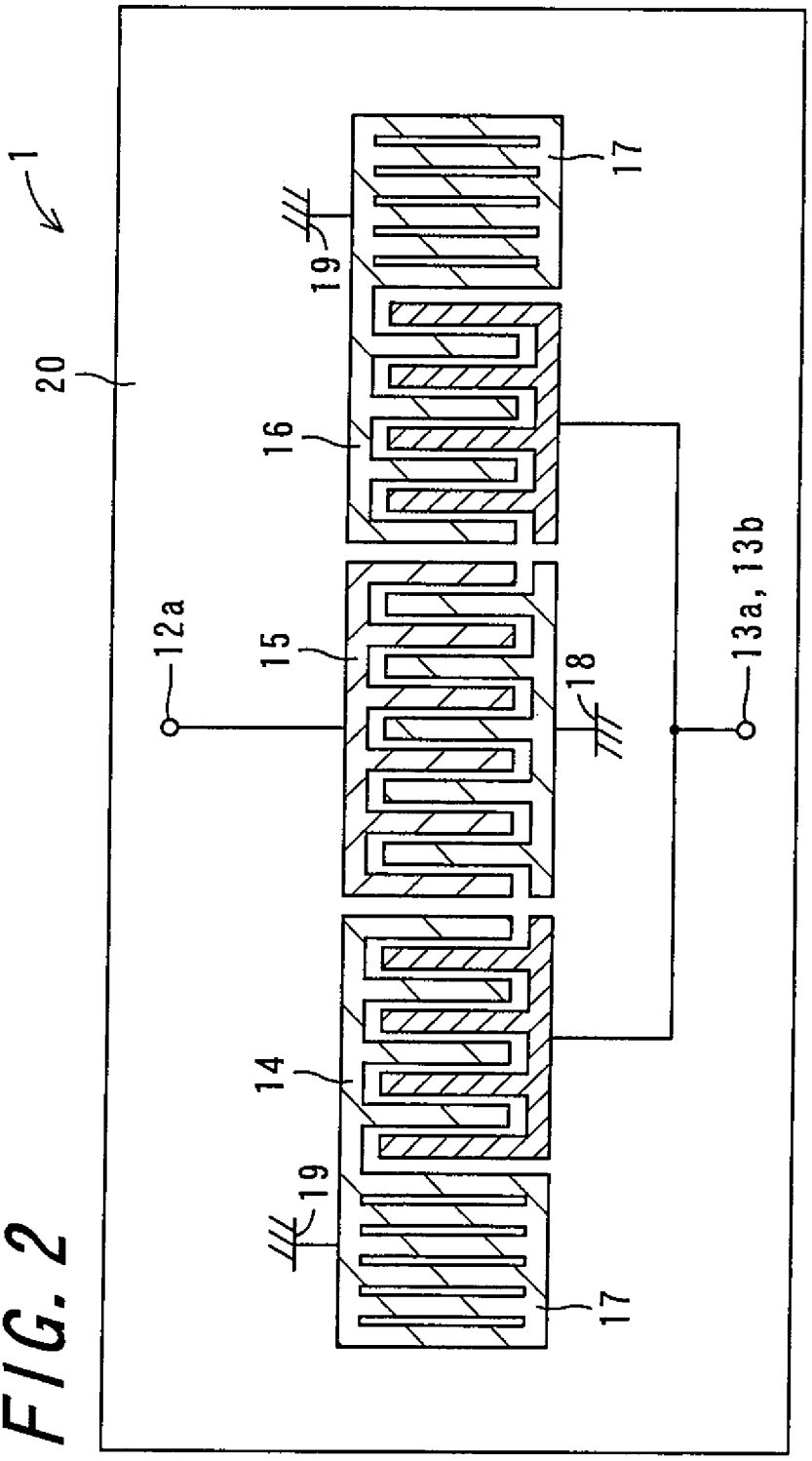
FIG. 2 is a plan view showing one example of the electrode structure of a surface acoustic wave device of the filter according to the embodiment.

FIG. 1 shows a circuit diagram of a filter according to the embodiment. Moreover, FIG. 2 is a plan view of the electrode configuration of a surface acoustic wave device used in the filter according to the embodiment.

As shown in FIG. 1, a filter 50a of the embodiment comprises a surface acoustic wave device 1, an input-side unbalanced signal terminal 12 and an output-side unbalanced signal terminal 13 each connected to the surface acoustic wave device 1, a first signal line 9 connected to one input-side unbalanced signal terminal 12, a second signal line 10 connected to the other output-side unbalanced signal terminal 13, and a shunt circuit 40 for providing connection between the first and second signal lines 9 and 10 in parallel with the surface acoustic wave device 1. In addition, the filter 50 includes an input-side capacitor 2 disposed in the first signal line 9 so as to be in series with respect to the surface acoustic wave device 1, a first inductor 3 disposed in the shunt circuit 40 at the side of the first signal line 9, and a series resonance circuit 11 having an output-side capacitor 4 and a second inductor 5 disposed in the shunt circuit 40 at the side of the second signal line 10.

By making capacitance or inductance adjustment to the input-side capacitor 2, the first inductor 3, the output-side capacitor 4, and the second inductor 5, a matching circuit of the filter 50a is constructed.

Thus, in the filter circuit using the first and second inductors 3 and 5 for the matching circuit, the series resonance circuit 11 is constructed by using the second inductor 5 constituting an output-side matching circuit. In this case, by adjusting the resonance frequency of a series resonant state gained by the output-side capacitor 4 and the second inductor 5 to the vicinity of a frequency band that requires high attenuation while effecting impedance matching in a broad frequency band, it is possible to render the out-of-pass band attenuation property of the SAW filter a high attenuation characteristic.

Moreover, since the first connection wiring line 9 is provided with the input-side capacitor 2 connected in series with respect to the surface acoustic wave device 1, it follows that a DC component of a signal propagating through the first connection wiring line 9 is interrupted by the input-side capacitor 2 and thus can hardly flow to the surface acoustic wave device 1, and eventually flows to ground through the first inductor 3. As a result, electrostatic destruction induced by the flow of a DC current of substantial magnitude through the surface acoustic wave device 1 can be significantly suppressed, with consequent improvement in the resistance of the surface acoustic wave device 1 to electrostatic destruction.

As shown in FIG. 2, the surface acoustic wave device 1 includes three IDT electrodes 14, 15, and 16 and reflector electrodes 17 formed on a piezoelectric substrate 20. The IDT electrodes 14, 15, and 16 are arranged along a propagation direction in which a surface acoustic wave propagates on the piezoelectric substrate 20. The reflector electrode 17 is located on both sides of the whole of the IDT electrodes 14 to 16. The IDT electrodes 14 to 16 and the reflector electrodes 17 have a plurality of electrode fingers extending in a direction perpendicular to the surface acoustic wave propagation direction.

Moreover, the ground-side electrode fingers of the IDT electrodes 14 to 16 of the surface acoustic wave device 1 are connected to ground electrode terminals 18 and 19. As shown in FIG. 1, the ground electrode terminals 18 and 19 are connected via a grounding line 6 to the ground electrode 8.

While the first inductor 3, the grounding line 6, and the series resonance circuit portion 11 are connected to the ground electrode 8, there is a parasitic inductance 7 between the ground electrode 8 and the first inductor 3, the grounding line 6, the series resonance circuit portion 11. The parasitic inductance 7 has an inductance value of 0.01 nH to 1 nH, for example.

With reference to FIGS. 3 to 5 and FIGS. 6A to 6F, an example of the case where the filter 50a shown in FIG. 1 is constructed on a wiring board or the like will be described below.

Figure 3:
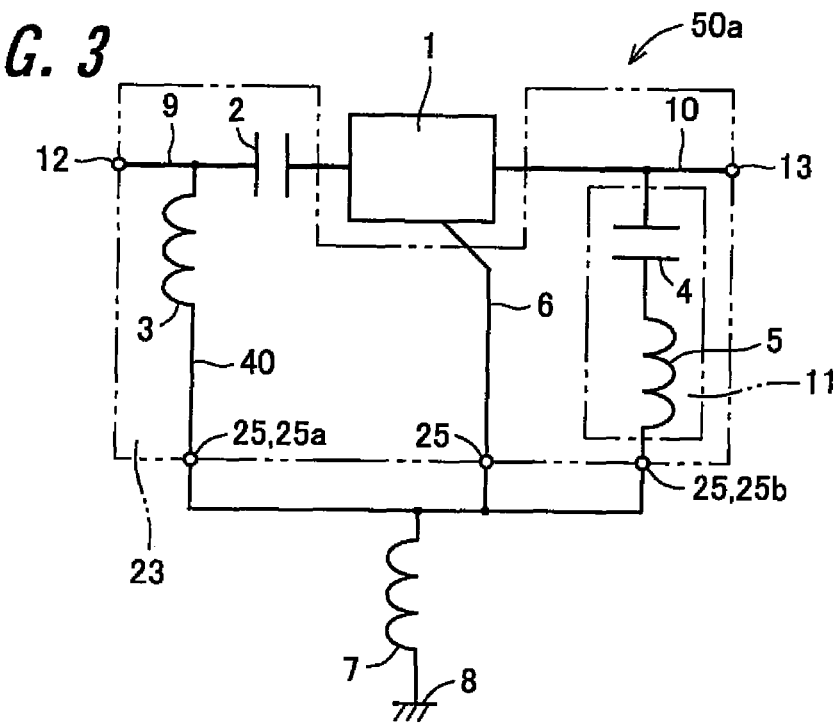
FIG. 3 is a circuit diagram showing the relationship between the filter circuit shown in FIG. 1 and a wiring board.

In FIG. 3, of the components constituting the filter 50a shown in FIG. 1, the ones formed on a wiring board 23 are enclosed by a broken line. That is, of the constituent components of the filter 50a, the input-side capacitor 2, the first inductor 3, the output-side capacitor 4, and the second capacitor 5 are formed on the wiring board 23.

In this way, the formation of the input-side capacitor 2, the first inductor 3, the output-side capacitor 4, and the second capacitor 5 constituting the matching circuit on the wiring board 23 does away with the need to dispose additional components such as a chip capacitor and a chip inductor outside the filter to obtain a matching circuit. This helps reduce the size of the overall configuration of the filter circuit as a whole.

Figure 4A:
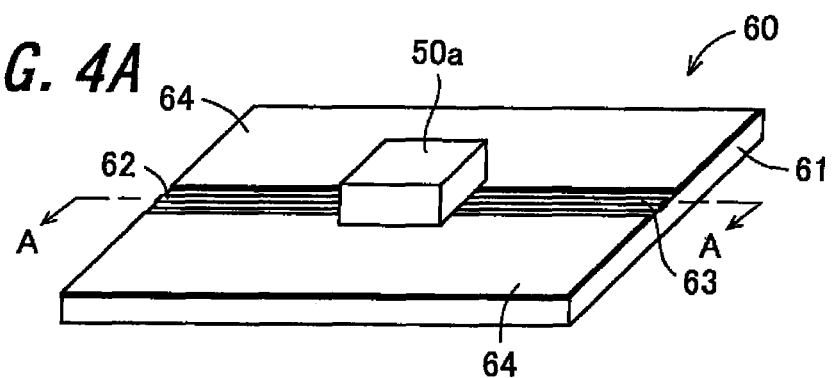
FIG. 4A is a view showing the filter 50a mounted on a printed-circuit board 60.
Figure 4B:
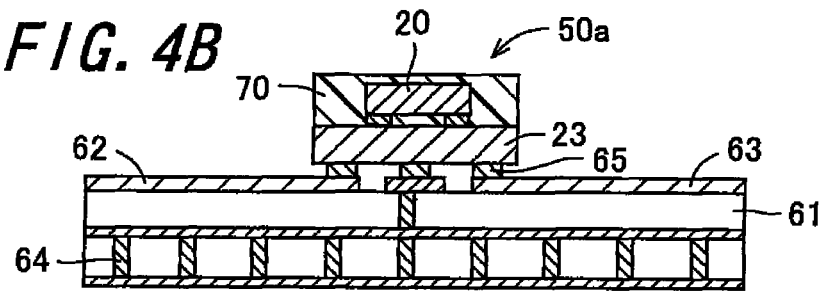
FIG. 4B is a view showing the filter 50a mounted on a printed-circuit board 60.

FIGS. 4A and 4B are views showing the filter 50a mounted on a printed-circuit board 60. FIG. 4A is a perspective view and FIG. 4B is a sectional view taken along the section line A-A of FIG. 4A.

The printed-circuit board 60 comprises a resin substrate 61, as well as an input signal wiring 62, an output signal wiring 63, and a ground wiring conductor 64 constituting the ground electrode 8 which are formed on a surface layer of the resin substrate 61. The resin substrate 61 is a flat plate-like insulating substrate made of glass·epoxy resin, paper·phenol, or the like material. The input signal wiring 62, the output signal wiring 63, and the ground wiring conductor 64 are made of a metal material such as Cu and are each patterned into a predetermined shape.

The input-side unbalanced signal terminal 12 of the filter 50a is connected to the input signal wiring 62, and the output-side unbalanced signal terminal 13 of the filter 50a is connected to the output signal wiring 63. Moreover, a reference potential terminal 25 shown in FIG. 3 is connected to the ground wiring conductor 64 disposed on the surface layer of the resin substrate 61. Note that, as employed in the descriptions of the embodiment and following embodiments, "reference potential" refers to ground potential, but there is no need for the reference potential to be zero volt.

Connection between each of various terminals at the side of the wiring board 23 and each of various wiring lines at the side of the printed-circuit board 60 is established by means of a connecting conductor 65 such as solder.

Moreover, the wiring board 23 has the piezoelectric substrate 20 mounted on a surface thereof opposite from the surface facing toward the printed-circuit board 60. The piezoelectric substrate 20 is mounted in a face-down manner so that the surface bearing the surface acoustic wave device 1 can be opposed to the wiring board 23. Connection between the wiring board 23 and the surface acoustic wave device 1 placed on the piezoelectric substrate 20 is also established by means of a connecting conductor such as solder. The piezoelectric substrate 20 mounted on the wiring board 23 is overmolded by a protective resin 70 made of epoxy resin or the like. This helps protect the surface acoustic wave device 1 from external environment.

In the case of the filter 50a of the embodiment, the ground wiring conductors 64 disposed on the surface layer and in the inner layer of the printed-circuit board 60 constitute the parasitic inductance 7.

Figure 5:
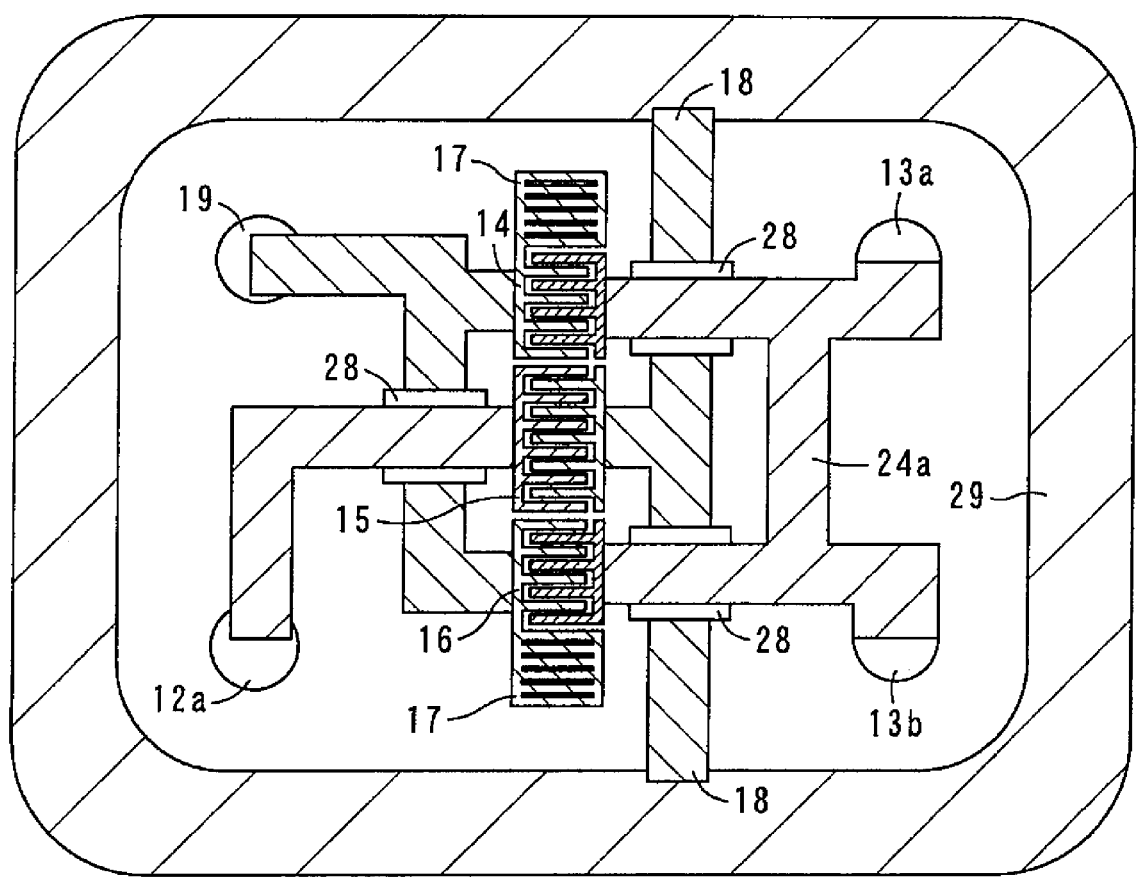
FIG. 5 is a plan view showing the surface acoustic wave device 1 mounted on the wiring board 23.

FIG. 5 is a plan view showing the surface acoustic wave device 1 mounted on the wiring board 23. In order to simplify an understanding of the wiring pattern of the surface acoustic wave device 1, in FIG. 5, there is shown a plane as viewed from the back surface of the piezoelectric substrate 20 in a see-through manner. Note that, in the example shown in FIG. 5, the branching of the path toward the output-side unbalanced signal terminal 13 and the path toward the series resonance circuit portion 11 off from the second signal line 10 is made in a wiring pattern 24a at the side of the surface acoustic wave device 1.

The wiring pattern of the surface acoustic wave device 1 is formed on one surface of the piezoelectric substrate 20. Therefore, in the case where signal wiring lines of different types intersect each other, after one of the wiring lines is formed on the surface of the piezoelectric substrate 20, an insulating layer 28 is formed on said wiring line at an intersection and then the other wiring line is formed on the insulating layer 28. In this construction, since different signal wiring lines intersect each other at the insulating layer 28, there is no need to arrange the signal wiring lines so as to go around each other, with consequent successful miniaturization of the surface acoustic wave device 1.

In the surface acoustic wave device 1, an input signal pad 12a, an output signal pad 13a, a reference potential pad 19, and a resonance circuit output pad 13b are placed at positions corresponding to corners of the piezoelectric substrate, respectively. Moreover, a reference potential annular pad 29 has an annular shape so as to surround other pads, the IDT electrodes, and so forth. The pads are connected to their respective terminals on the surface of the wiring board 23.

The wiring board 23 is constructed by stacking a plurality of dielectric layers to assume a multilayer wiring structure. On the surface layer of the wiring board 23 are disposed the terminals to be connected with the pads of the surface acoustic wave device 1, and in the interior thereof are disposed the first capacitor 2, the first inductor 3, and the series resonance circuit 11.

Each dielectric layer is made, for example, of glass ceramics, and each wiring pattern is made of a metal material composed predominantly of silver, copper, gold, tungsten, or the like.

FIGS. 6A to 6F are plan views showing the layer configuration of the wiring board 23. In FIGS. 6A to 6F, there is shown the wiring pattern of each layer as viewed from a mounting surface 200 on which is mounted the piezoelectric substrate 20.

Figure 6A:
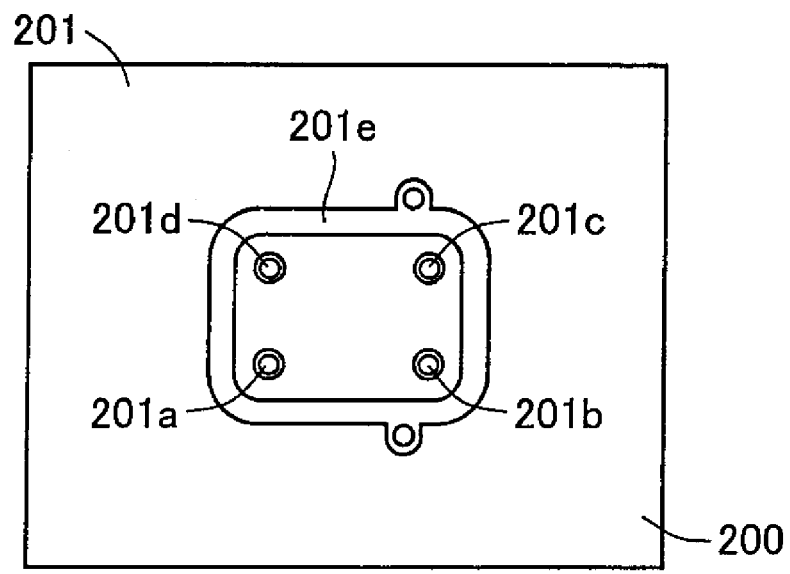
FIG. 6A is a plan view showing the layer configuration of the wiring board 23.
Figure 6B:
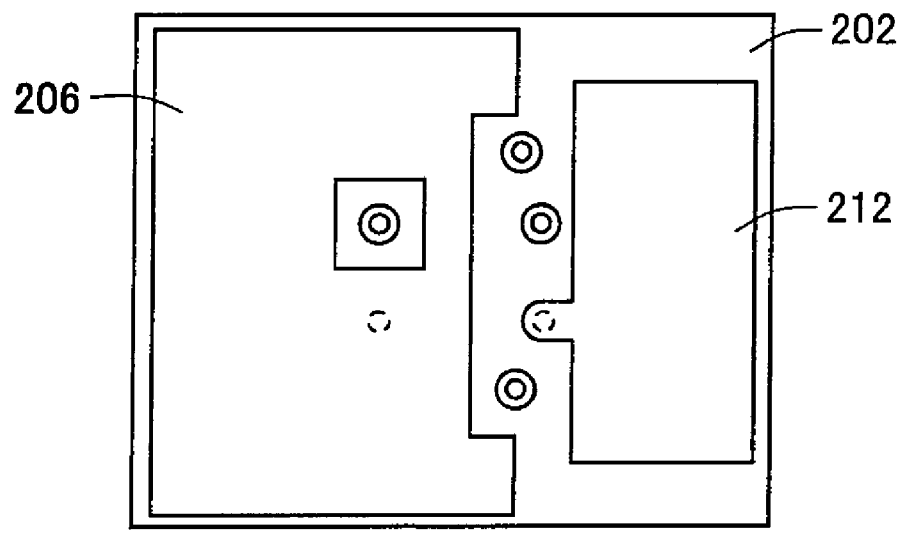
FIG. 6B is a plan view showing the layer configuration of the wiring board 23.
Figure 6C:
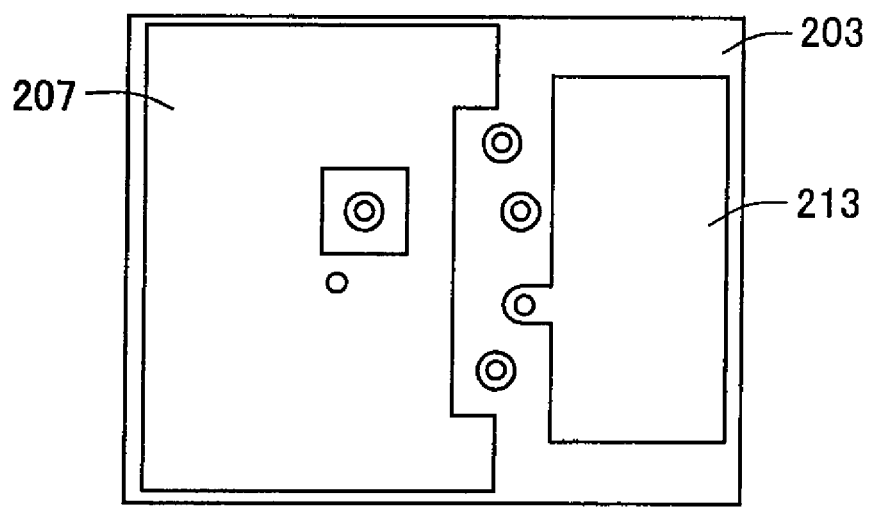
FIG. 6C is a plan view showing the layer configuration of the wiring board 23.
Figure 6D:
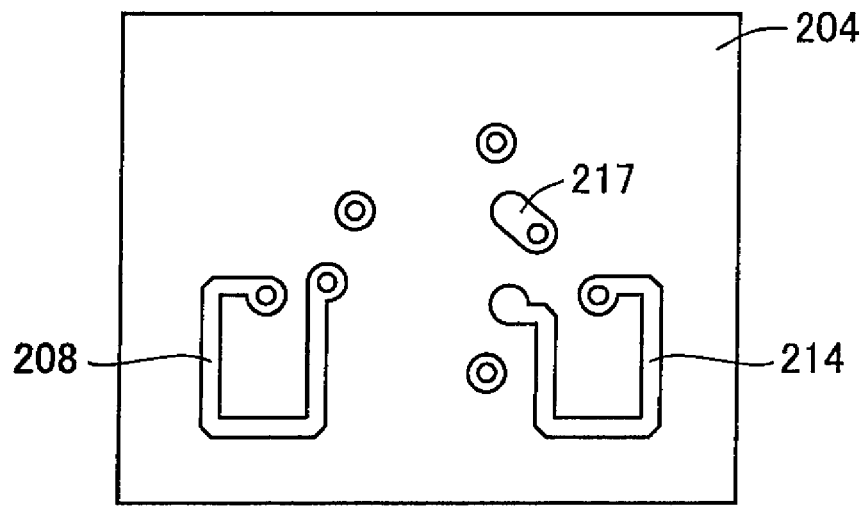
FIG. 6D is a plan view showing the layer configuration of the wiring board 23.
Figure 6E:
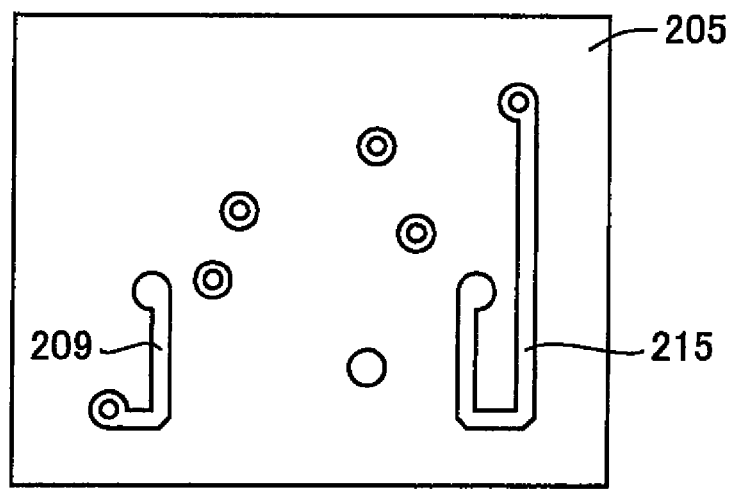
FIG. 6E is a plan view showing the layer configuration of the wiring board 23.
Figure 6F:
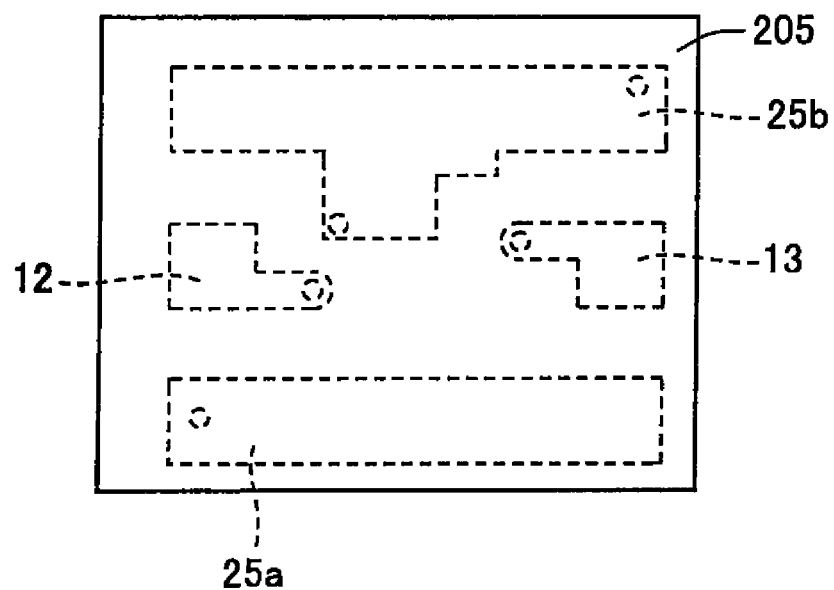
FIG. 6F is a plan view showing the layer configuration of the wiring board 23.

The wiring board 23 shown in FIGS. 6A to 6F is composed of five dielectric layers. FIG. 6A shows the wiring pattern of a first layer 201, FIG. 6B shows the wiring pattern of a second layer 202, FIG. 6C shows the wiring pattern of a third layer 203, FIG. 6D shows the wiring pattern of a fourth layer 204, and FIG. 6E shows the wiring pattern of a fifth layer 205. FIG. 6F shows the wiring pattern at the side of the back surface of the fifth layer 205.

The mounting surface 200 of the first layer 201 is formed with mounting terminals 201a, 201b, 201c, and 201d and an annular mounting terminal 201e that make connection with the pads of the surface acoustic wave device 1. The mounting terminal 201a is a terminal connected to the input signal pad 12a. The mounting terminal 201b is a terminal connected to the resonance circuit output pad 13b. The mounting terminal 201c is a terminal connected to the output signal pad 13a. The mounting terminal 201d is a terminal connected to the reference potential pad 19. The annular mounting terminal 201e is a terminal connected to the reference potential annular pad 29.

The mounting terminal 201a is connected to a first capacitor conductor 206 formed on the second layer 202 by means of a through conductor such as a via-conductor. The first capacitor conductor 206 constitutes the input-side capacitor 2 in conjunction with a second capacitor conductor 207 formed on the third layer 203, with the dielectric layer of the second layer 202 lying therebetween.

The capacitance value of the first capacitor 2 can be controlled by adjusting the areas of the first capacitor conductor 206 and the second capacitor conductor 207, the specific permittivity of the dielectric layer of the second layer 202, and the spacing between the first capacitor conductor 206 and the second capacitor conductor 207 (the thickness of the dielectric layer of the second layer 202).

The second capacitor conductor 207 is connected to a first inductor conductor 208 formed on the fourth layer 204 by means of a through conductor. The first inductor conductor 208 is connected to a second inductor conductor 209 formed on the fifth layer 205 by means of a through conductor and is further connected to a reference potential terminal 25a disposed on the back surface of the fifth layer 205. Moreover, the second capacitor conductor 207 is connected to the input-side unbalanced signal terminal 12 disposed on the back surface of the fifth layer 205 via a through conductor formed in the fourth layer 204 and the fifth layer 205.

The first inductor conductor 208 and the second inductor conductor 209 connected in series to each other constitute the first inductor 3. The inductance value of the first inductor 3 is determined according to a distance to the wiring pattern of a nearby ground potential, the types of conductor materials, wiring width and wiring thickness, and wiring length, and is controlled by adjusting mainly the wiring length.

In this way, the input-side capacitor 2 and the first inductor 3 can be formed within the wiring board 23.

The mounting terminal 201b is connected to a third capacitor conductor 212 formed on the second layer 202 by means of a through conductor. The third capacitor conductor 212 constitutes the output-side capacitor 4 in conjunction with a fourth capacitor conductor 213 formed on the third layer 203, with the dielectric layer of the second layer 202 lying therebetween.

The capacitance value of the output-side capacitor 4 can be controlled by adjusting the areas of the third capacitor conductor 212 and the fourth capacitor conductor 213, the specific permittivity of the dielectric layer of the second layer 202, and the spacing between the third capacitor conductor 212 and the fourth capacitor conductor 213 (the thickness of the dielectric layer of the second layer 202).

The fourth capacitor conductor 213 is connected to a third inductor conductor 214 formed on the fourth layer 204 by means of a through conductor. The third inductor conductor 214 is connected to a fourth inductor conductor 215 formed on the fifth layer 205 by means of a through conductor and is further connected to a reference potential terminal 25b disposed on the back surface of the fifth layer 205.

The third inductor conductor 214 and the fourth inductor conductor 215 connected in series to each other constitute the second inductor 5. The inductance value of the second inductor 5 is determined according to a distance to the wiring pattern of a nearby ground potential, the types of conductor materials, wiring width and wiring thickness, and wiring length, and is controlled by adjusting mainly the wiring length.

In this way, the series resonance circuit portion 11 constructed by connecting the output-side capacitor 4 and the second inductor 3 in series can be formed within the wiring board 23.

The mounting terminal 201c is formed so as to pass through the first layer 201, the second layer 202, and the third layer 203 by means of a through conductor for connection with a short wiring pattern 217 formed on the fourth layer 204. The wiring pattern 217 is formed so as to pass through the fourth layer 204 and the fifth layer 205 by means of a through conductor for connection with the output-side unbalanced signal terminal 13 disposed on the back surface of the fifth layer 205.

The mounting terminal 201d is formed so as to pass all the way through from the first layer 201 to the fifth layer 205 by means of a through conductor for connection with the reference potential terminal 25b disposed on the back surface of the fifth layer 205.

Moreover, the annular mounting terminal 201e is connected to the reference potential terminals 25a and 25b disposed on the back surface of the fifth layer 205 via through conductors formed in the first to fifth layers 201 to 205, respectively.

Next, a description will be given below as to an example of the method of constructing the filter shown in FIG. 5. Firstly, the IDT electrodes 14 to 16 and the reflector electrode 17 made of an Al (99% by mass)-Cu (1% by mass) alloy are formed on a piezoelectric substrate made for example of a 38.7 degree-rotated Y-cut X-direction propagation $LiTaO_3$ single crystal. At the same time, undercoat layers for the pads 12a, 13a, 13b, and 19 are formed.

A method of obtaining each electrode involves a step of film formation using a sputtering apparatus and a step of patterning by means of photolithography using a reduced projection exposure apparatus (stepper) and a RIE (Reactive Ion Etching) apparatus.

Following the formation of the electrodes on the piezoelectric substrate, a protective film is formed. For example, the protective film is obtained by forming a $SiO_2$ film for covering the electrodes by using a CVD (Chemical Vapor Deposition) apparatus. Note that the pad portions to be connected to the terminals of the wiring board 23 are left exposed from the protective film.

Next, on the undercoat layer of each pad exposed from the protective film is stacked a Cr layer, a Ni layer, and a Au layer to form the pads 12a, 13a, 13b, 19, and 29. After that, a solder bump is formed on the pad by means of printing technique or reflow furnace to mount the surface acoustic wave device 1 on the wiring board 23 in a flip-chip manner.

Next, the piezoelectric substrate formed with the surface acoustic wave device is mounted on the wiring board in such a manner that its surface bearing the pads can be a lower surface by using a flip-chip mounting apparatus. In this way, the formation of the filter 50a shown in FIG. 3 is brought to completion.

Figure 7:
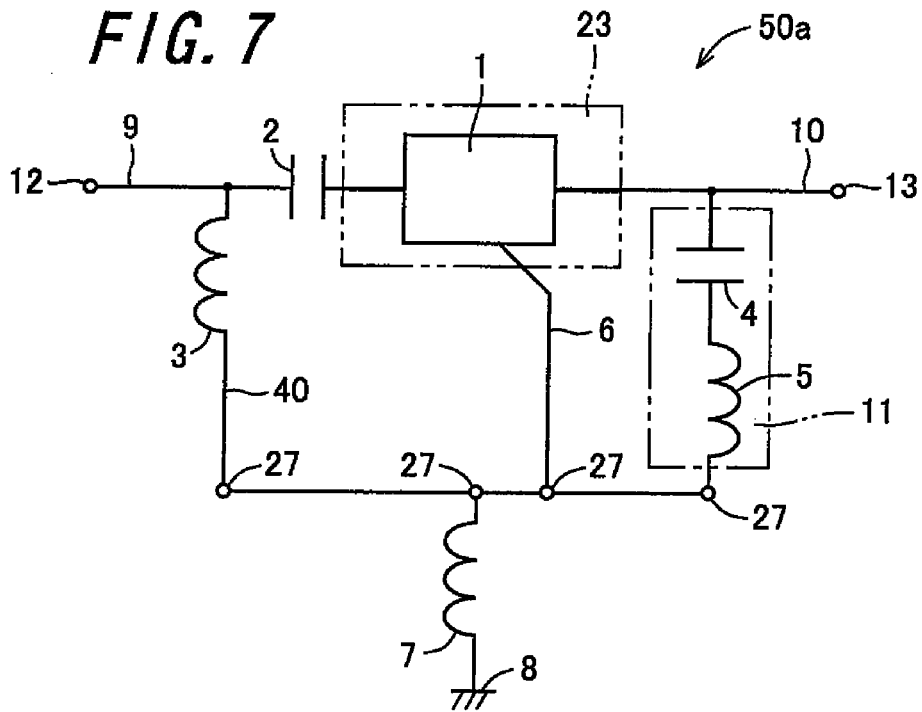
FIG. 7 is a circuit diagram showing the relationship between the filter circuit shown in FIG. 1 and the wiring board.

In FIG. 7, there is shown another example of the case where the filter 50a shown in FIG. 1 is constructed on a wiring board or the like. Just like FIG. 3, the constituent component on the wiring board 23 is enclosed by a broken line.

Figure 8:
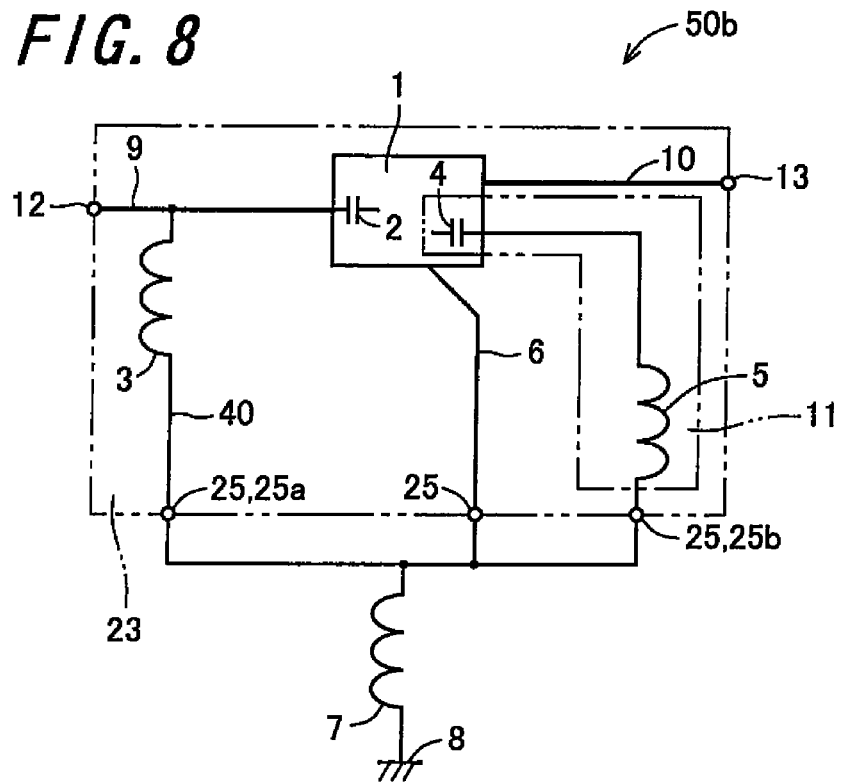
FIG. 8 shows a circuit diagram of a filter according to another embodiment.
Figure 9:
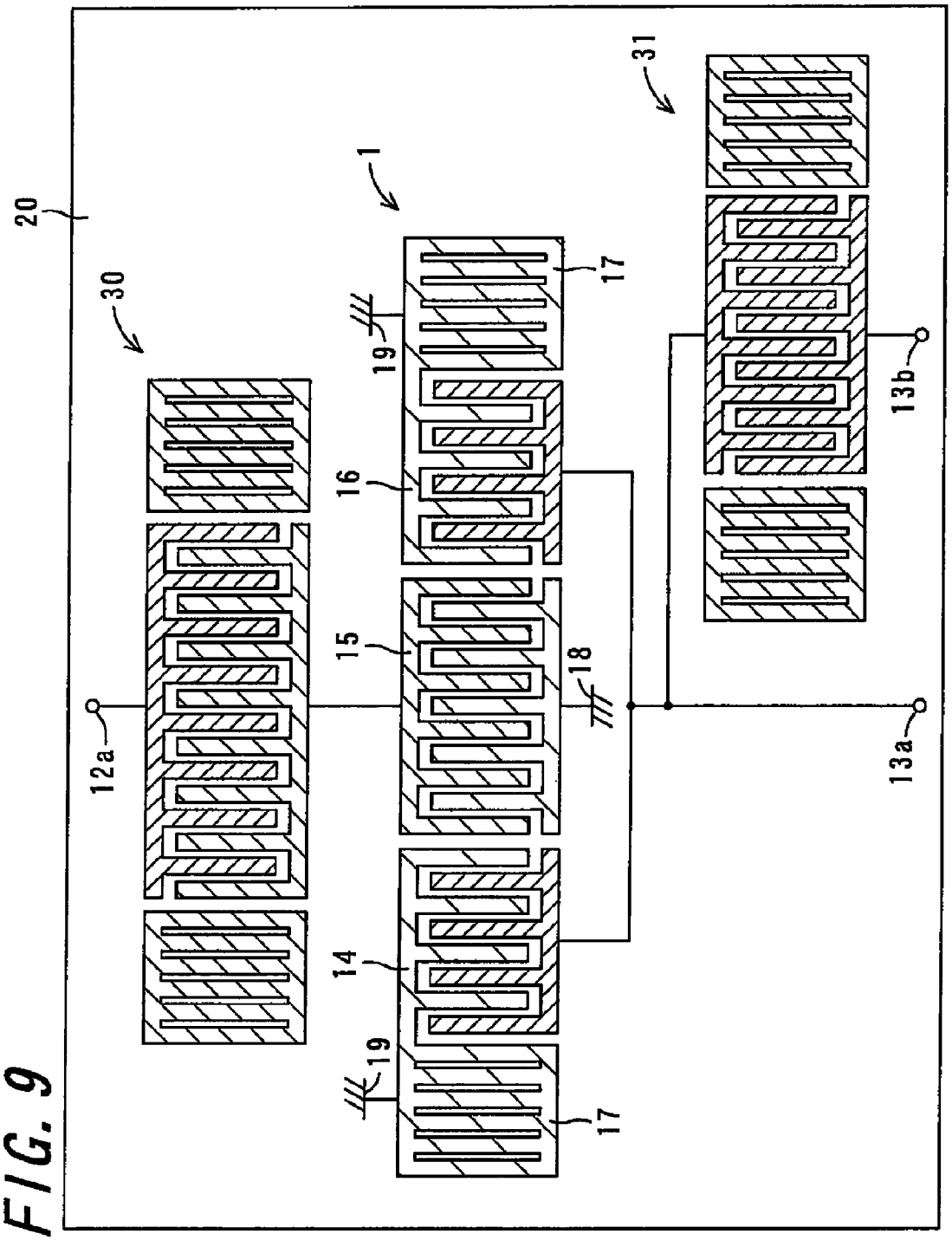
FIG. 9 is a plan view showing another example of the electrode structure of the surface acoustic wave device of the filter according to the embodiment.

In the example shown in FIG. 7, mounted on the wiring board 23 is the surface acoustic wave device 1 alone. Other components constituting the filter 50a are all formed outside the wiring board 23. That is, the input-side capacitor 2, the first inductor 3, the output-side capacitor 4, and the second inductor 5 are disposed at the side of the printed-circuit board GO on which is mounted the wiring board 23. The input-side capacitor 2, the first inductor 3, the output-side capacitor 4, and the second inductor 5 are formed by using a chip capacitor and a chip inductor, for example. This case provides the advantage of allowing an adjustment afterwards to render the input-side capacitor 2, the first inductor 3, the output-side capacitor 4, and the second inductor 5 constituting the matching circuit suitable for filter matching. FIG. 8 shows a circuit diagram of a filter 50b according to another embodiment. FIG. 9 is a plan view of the electrode configuration of the surface acoustic wave device 1 provided in the filter 50b shown in FIG. 8.

In the filter 50b shown in FIG. 8, the input-side capacitor 2 and the output-side capacitor 4 are constructed of a surface acoustic wave resonator 30 and a surface acoustic wave resonator 31, respectively, formed on the piezoelectric substrate 20.

As shown in FIG. 9, the piezoelectric substrate 20 used in this embodiment is provided with, in addition to the surface acoustic wave device 1, the surface acoustic wave resonators 30 and 31. The surface acoustic wave resonator 30 is located between the surface acoustic wave device 1 and the input ground pad 12a, and the surface acoustic wave resonator 31 is located between the surface acoustic wave device 1 and the resonance circuit output pad 13b.

In the case of constituting the input-side capacitor 2 and the output-side capacitor 4 by the surface acoustic wave resonators 30 and 31, as compared with the case where capacitor conductors are formed within the wiring board 23, the wiring board 23 can be made more compact, with consequent successful miniaturization of the overall structure of the filter. Moreover, since the surface acoustic wave resonators 30 and 31 are formed by a thin-film forming technique such as a vapor deposition method, a sputtering method, and a CVD method, as compared with the case of forming the input-side capacitor 2 and the output-side capacitor 4 within the wiring board 23 by means of capacitor conductors, it is possible to reduce so-called process variation and thereby minimize the dispersion in the values of electrostatic capacitance. Moreover, by adjusting the resonance frequency of the surface acoustic wave resonator 30, 31 to the vicinity of a frequency band requiring high attenuation, it is possible to render the out-of-pass band attenuation property of the SAW filter a high attenuation characteristic.

Figure 10A:
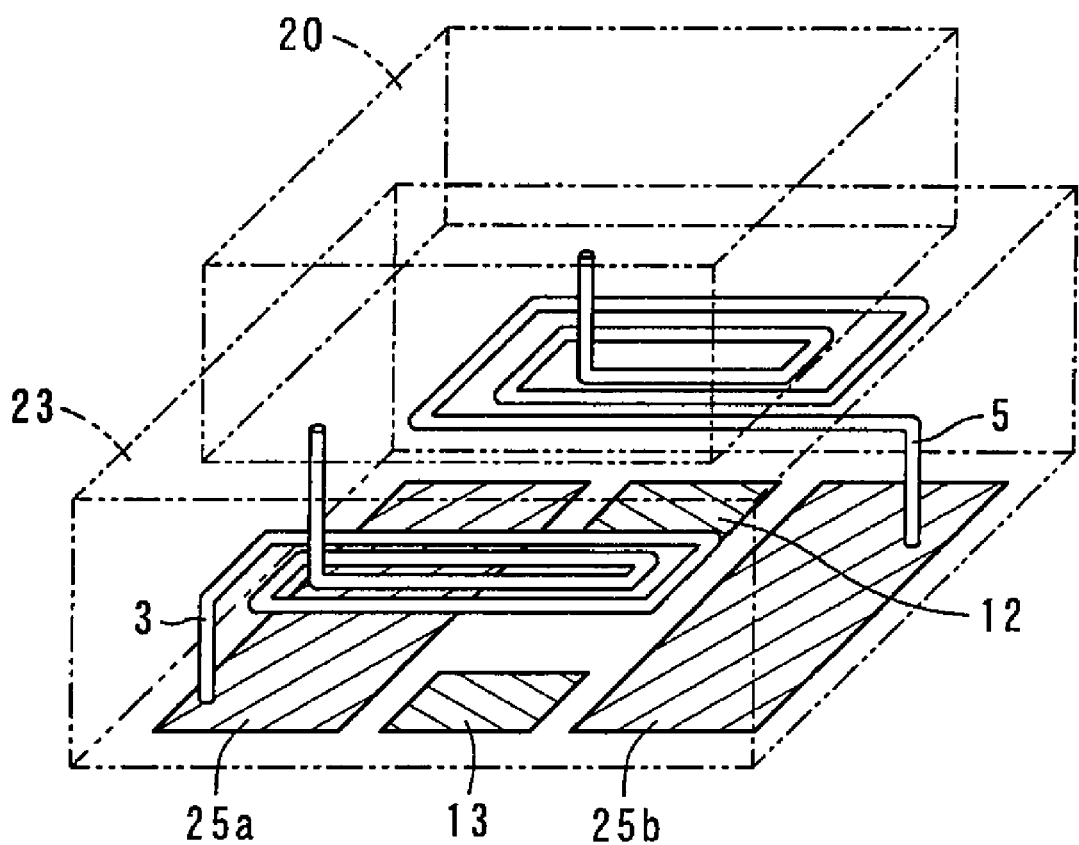
FIG. 10A is a perspective view of the filter according to the embodiment, illustrating one example of the arrangement of reference potential terminals formed in the wiring board.

Next, desirable placement position and shape of the reference potential terminal 25 formed on the lower surface of the wiring board 23 will be described with reference to FIGS. 10A to 10C. FIG. 10A is a see-through perspective view showing a state where the piezoelectric substrate 20 is mounted on the wiring board 23. The figure shows only the first and second inductors 3 and 5 and the first and second reference potential terminals 25a and 25b.

Figure 10B:
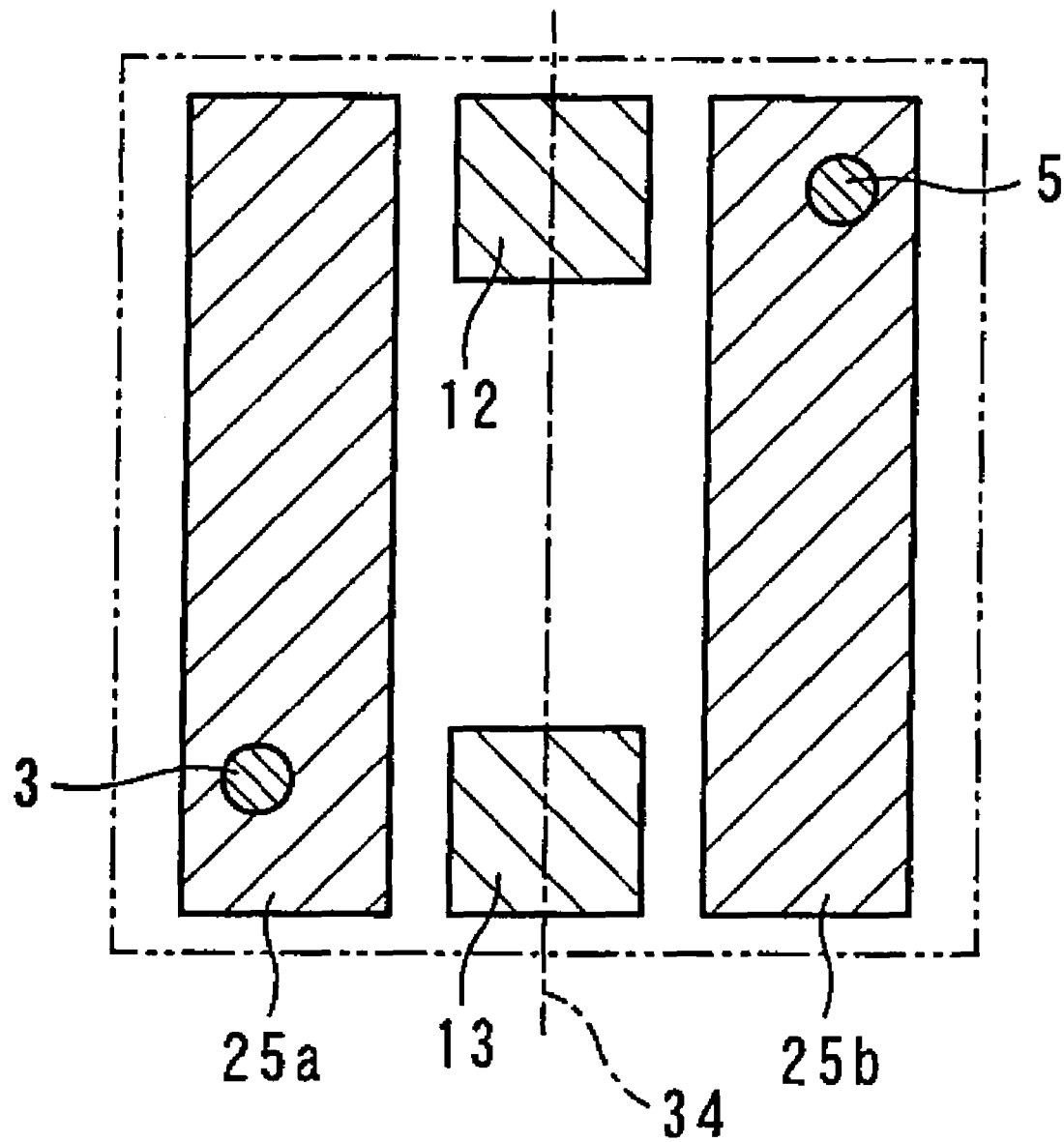
FIG. 10B is a plan view showing an example of the arrangement of the reference potential terminals formed on the back surface of the wiring board.

In FIG. 10B, there is shown an example in which the first and second reference potential terminals 25a and 25b are oppositely disposed at a spacing on the back surface of the wiring board 23, with the input-side unbalanced signal terminal 12 and the output-side unbalanced signal terminal 13 lying therebetween. As shown in the figure, the first reference potential terminal 25a and the second reference potential terminal 25b are arranged in line-symmetrical relation with respect to a centerline 34.

Figure 10C:
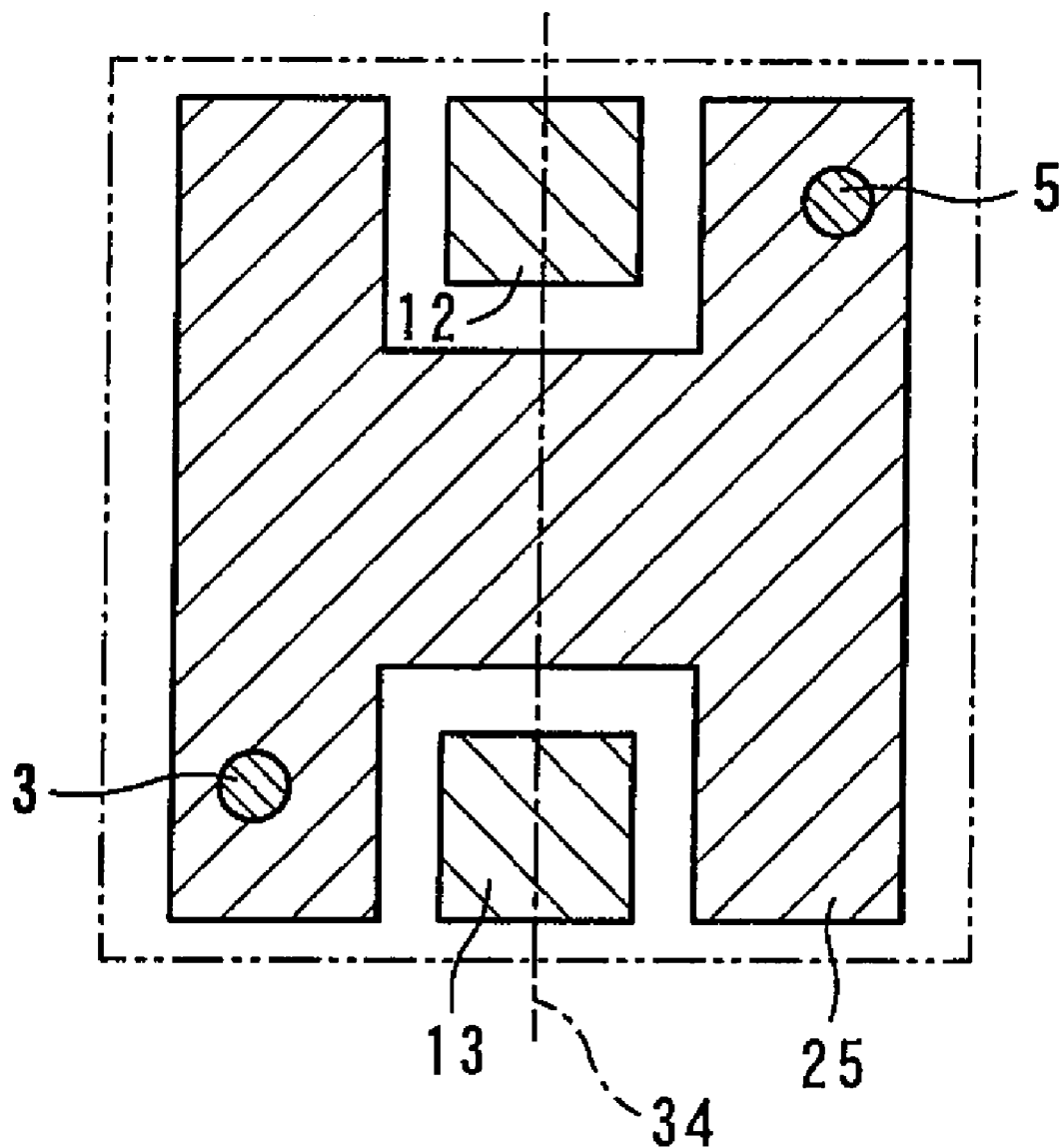
FIG. 10C is a plan view showing another example of the arrangement of the reference potential terminals formed on the back surface of the wiring board.

On the other hand, in FIG. 10C, there is shown an example which is the same as the example shown in FIG. 10B in that the first and second reference potential terminals 25a and 25b are so arranged that the input-side unbalanced signal terminal 12 and the output-side unbalanced signal terminal 13 lie therebetween, but differs therefrom in that the first reference potential terminal 25a and the second reference potential terminal 25b are connected to each other. The area acting as the connection between the first reference potential terminal 25a and the second reference potential terminal 25b is located between the input-side unbalanced signal terminal 12 and the output-side unbalanced signal terminal 13. The first reference potential terminal 25a and the second reference potential terminal 25b, including their connecting portions, are arranged in line-symmetrical relation with respect to the centerline 34.

By forming the first and second reference potential terminals 25a and 25b according to the shape and placement relationship as shown in FIGS. 10A to 10C, the leakage of signals from one signal line 9 to the other signal line 10 can be reduced, wherefore the out-of-pass band attenuation property of the SAW filter can be an even higher attenuation characteristic.

Figure 11:
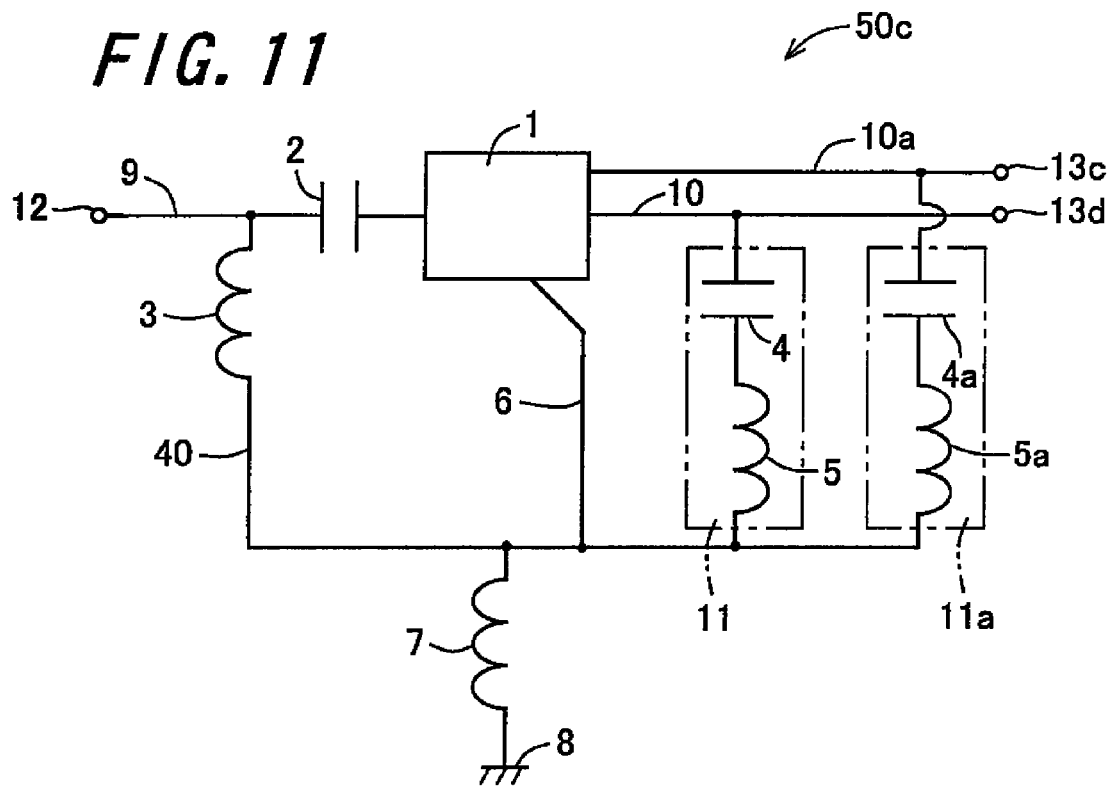
FIG. 11 is a circuit diagram of a filter according to still another embodiment.

FIG. 11 is a circuit diagram of a filter according to still another embodiment.

A filter 50c shown in FIG. 11 is similar in configuration to the filter 50a shown in FIG. 1, and the only difference is that, in the former, output from the surface acoustic wave device 1 is not an unbalanced signal but a balanced signal. That is, since an output signal is a balanced signal, even numbers of output terminals are required. In this embodiment, the surface acoustic wave device 1 has two output terminals, namely a balanced signal terminal 13c and a balanced signal terminal 13d. A balanced signal outputted from the balanced signal terminal 13c and a balanced signal outputted from the balanced signal terminal 13d are in phase inversion.

A second signal line 10 is provided with a series resonance circuit portion 11 having an output-side capacitor 4 and a second inductor 5. A second signal line 10a is provided with a series resonance circuit portion 11a having an output-side capacitor 4a and a second inductor 5a.

In this construction, even if an output signal is a balanced signal, by achieving impedance matching in a broad frequency band, imparting wide-range and low-loss pass band properties to the SAW filter, and adjusting the resonance frequency of a series resonant state gained by the output-side capacitor 4 and the second inductor 5 as well as the resonance frequency of a series resonant state gained by the output-side capacitor 4a and the second inductor 5a to the vicinity of a frequency band requiring high attenuation, it is possible to render the out-of-pass band attenuation property in a common mode of the SAW filter a high attenuation characteristic.

Moreover, the filter pursuant to the invention is applicable to a communications apparatus. That is, in a communications apparatus having at least one of a receiving circuit and a transmitting circuit, the filter may be used as a band-pass filter included in the circuit. For example, the filter is applicable to a communications apparatus having a transmitting circuit for modulating a transmission signal outputted from a transmitting circuit so as to be carried on a carrier frequency by a mixer, attenuating an unnecessary signal by a band-pass filter, amplifying the transmission signal by a power amplifier, and allowing the signal to be transmitted from an antenna through a duplexer. The filter is also applicable to a communications apparatus having a receiving circuit for receiving a signal by an antenna, amplifying the received signal which passed through a duplexer by a low-noise amplifier, attenuating an unnecessary signal by a band-pass filter, separating the signal from a carrier frequency by a mixer, and transmitting the signal to a receiving circuit for extraction.

Figure 12:
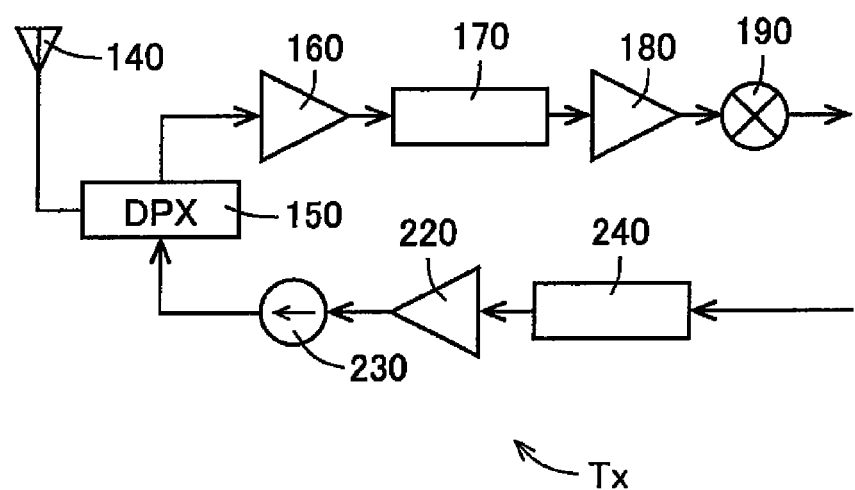
FIG. 12 is a block diagram showing a communications apparatus according to the embodiment.

FIG. 12 is a block diagram showing a communications apparatus according to one embodiment of the invention. In FIG. 12, a transmitting circuit Tx and a receiving circuit Rx are each connected via a branching device 150 to an antenna 140. A radio-frequency signal transmitted is subjected to unnecessary signal removal at a filter 240, is amplified by a power amplifier 220, passes through an isolator 230 and the branching device 150, and is then emitted from the antenna 140. On the other hand, a radio-frequency signal received by the antenna 140 passes through the branching device 150, is amplified by a low-noise amplifier 160, is subjected to unnecessary signal removal at a filter 170, is re-amplified by an amplifier 180, and is then converted into a low-frequency signal by a mixer 190.

Accordingly, by adopting the filter of this embodiment, there is provided an excellent communications apparatus which offers significantly high sensitivity.

Figure 13:
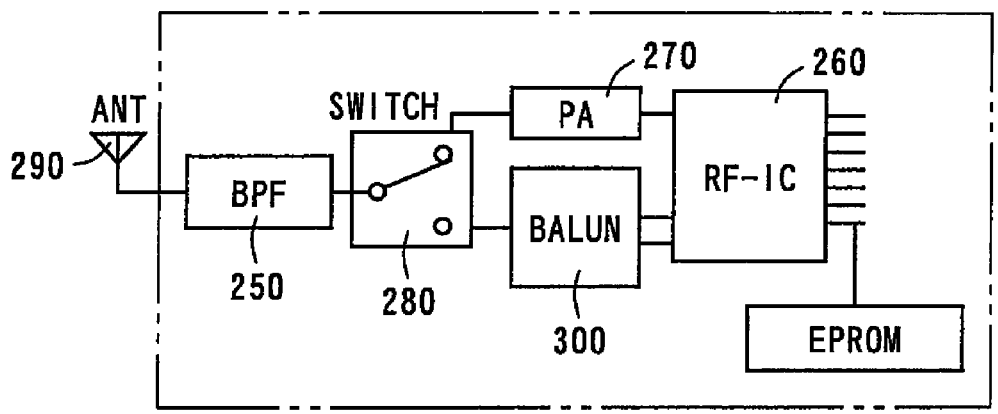
FIG. 13 is the block diagram showing the communications apparatus according to the embodiment.

FIG. 13 is a block diagram showing a communications apparatus according to another embodiment of the invention. The communications apparatus of this embodiment is built as a wireless LAN communications module, for example. In this embodiment, one of the filters implemented by way of the above-described embodiments is used as a band-pass filter 250. In regard to the workings of the module for transmission operation, firstly, a transmission signal outputted from a transmitting circuit section of a radio-frequency integrated circuit (RF-IC) 260 is amplified by a power amplifier (PA) 270. Then, the signal passes through a switch 280, now placed in a transmission mode, so as to be inputted to the band-pass filter (BPF) 250. In the band-pass filter 250 based on the filter of the invention, an unnecessary signal included in the transmission signal is attenuated, so that a radio-frequency signal can be emitted from an antenna 290.

In regard to the workings of the module for transmission operation, a radio-frequency signal is received by the antenna 290, and an unnecessary signal included in the received signal is attenuated by the band-pass filter 250 based on the filter of the invention. Then, the signal passes through the switch 280, now placed in a reception mode, so as to be subjected to conversion at a balance-unbalance converter 300, and is whereafter inputted to a receiving circuit section of the radio-frequency integrated circuit 260. The balance-unbalance converter 300 may be replaced with a band-pass filter based on the filter of the invention.

Accordingly, by adopting the filter of this embodiment, there is provided an excellent wireless LAN communications module which offers significantly high sensitivity.

Moreover, a frequency filter free of duplexer can be constructed by using the filter of this embodiment. That is, the filter of this embodiment is preferably inserted in an antenna-side signal line of a communications apparatus. For example, the first signal line 9 connected with the first inductor 3 in the filter shown in FIG. 1 is inserted in the antenna-side signal line of the communications apparatus as a line closest to the antenna. In this case, a DC component of a signal received by the antenna is interrupted by the input-side capacitor 2, wherefore it does not flow to the surface acoustic wave device 1 but flows to the ground electrode 8 through the first inductor 3. As a result, electrostatic destruction induced by the flow of a DC current of substantial magnitude through the surface acoustic wave device 1 can be significantly suppressed, with consequent improvement in the resistance of the surface acoustic wave device 1 to electrostatic destruction.

EXAMPLES

Next, Examples of the filter of the invention will be described below.

Example 1

Figure 19:
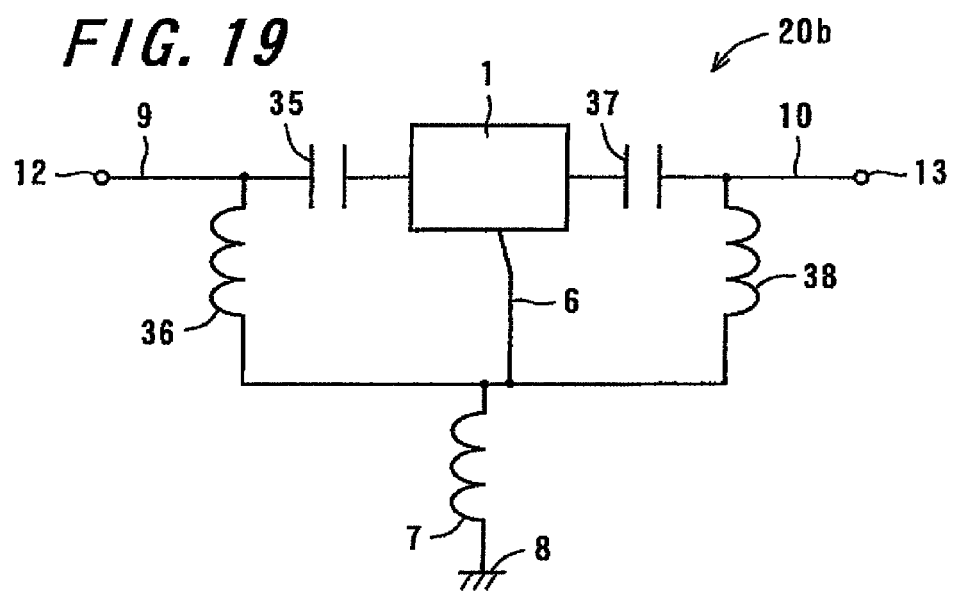
FIG. 19 is a circuit diagram of a SAW filter of Comparative Example.
Figure 20:
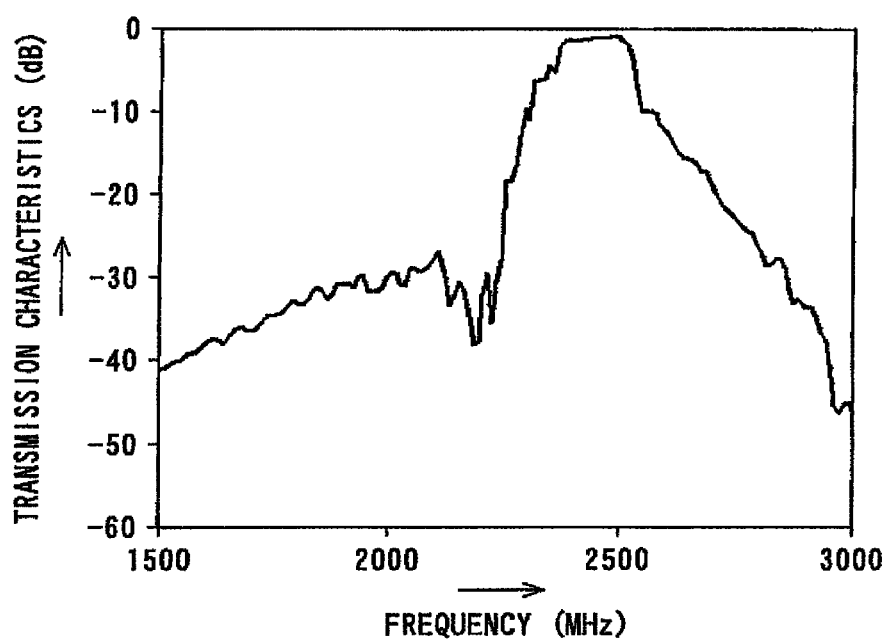
FIG. 20 is a graph showing the frequency-transmission characteristic relationship in the vicinity of the pass band obtained with the SAW filter shown in FIG. 17 in a condition of actual service.

By way of Example 1, a filter 50a having a circuit configuration as shown in FIG. 3 was fabricated with use of a surface acoustic wave device 1 having an electrode configuration as shown in FIG. 2. In addition, by way of Comparative Example 1, a filter 20b having a circuit configuration as shown in FIG. 19 was fabricated with use of a surface acoustic wave device having an electrode configuration as shown in FIG. 2. The electrical characteristics of each of Example 1 and Comparative Example 1 were obtained by running computer simulation. The filters range in operating frequency from 1500 MHz to 3000 MHz and range in passband frequency from 2410 MHz to 2510 MHz.

Moreover, in Example 1, the input-side capacitor 2 is set in capacitance at 4.3 pF, the output-side capacitor 4 is set in capacitance at 1.7 pF, the first inductor 3 is set in inductance at 3.5 nH, and the second inductor 5 is set in inductance at 4.1 nH. In Comparative Example 1, the input-side capacitor 35 and the output-side capacitor 37 are each set in capacitance at 4.0 pF, and the first inductor 36 and the second inductor 38 are each set in inductance at 1.6 nH.

The capacitances of the input-side capacitor 2 and the output-side capacitor 4 and the inductances of the first inductor 3 and the second inductor 5 are determined as follows.

Figure 21A:
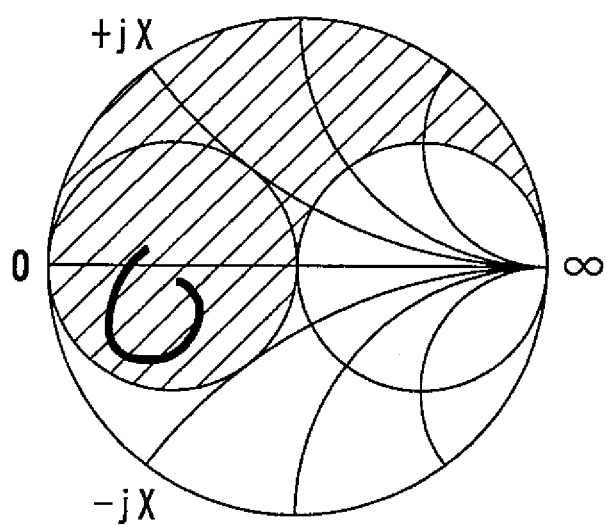
FIG. 21A is a view for explaining a method for adjustment of impedance and the capacitances of elements constituting a matching circuit in the filter of Example 1.
Figure 21B:
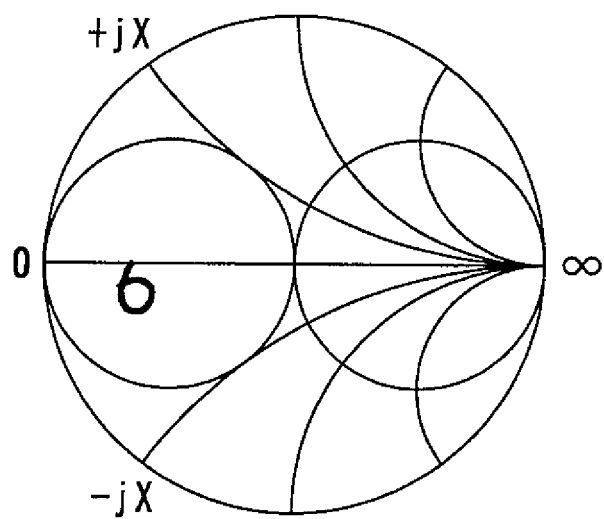
FIG. 21B is a view for explaining the method for adjustment of impedance and the capacitances of elements constituting the matching circuit in the filter of Example 1.
Figure 21C:
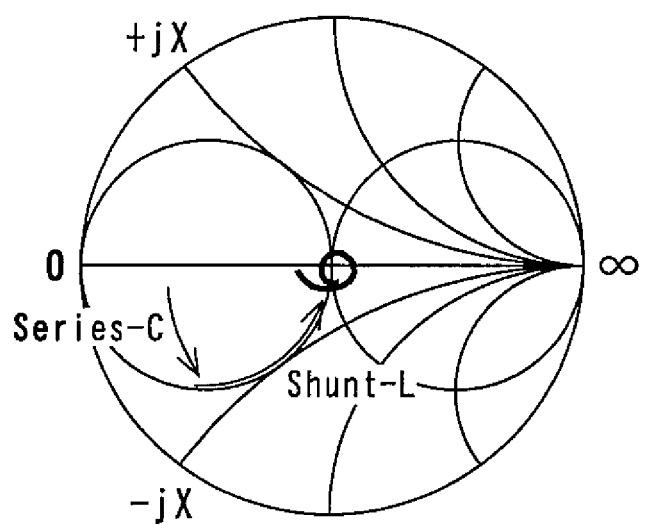
FIG. 21C is a view for explaining the method for adjustment of impedance and the capacitances of elements constituting the matching circuit in the filter of Example 1.

FIGS. 21A to 21C are views for explaining a method for adjustment of impedance and the capacitances of elements constituting the matching circuit in the filter of Example 1.

At first, the impedance in the pass band of the surface acoustic wave device 1 prior to matching is calculated and the result of calculation is plotted on a Smith chart. In the case of Example 1, the loci of the impedance prior to matching lie within a diagonally shaded region shown in FIG. 21A. In this case, impedance matching can be achieved with a circuit configuration of the input-side capacitor 2 and the first inductor 3.

Next, the resonance frequency of the series resonance circuit portion 11 formed of the output-side capacitor 4 and the second inductor 5 is adjusted to 1900 MHz which falls outside the pass band. While resonance frequency adjustment can be made by combining a capacitance C of the output-side capacitor 4 and an inductance L of the second inductor 5 in such a manner that a condition of $f=1/(2\pi\sqrt{(LC)})$ is fulfilled, the values of the output-side capacitor 4 and the second inductor 5 are so selected that, looking on the Smith chart, the range of loci of the impedance within the pass band can be narrowed to a minimum (FIG. 21B).

Then, the values of the input-side capacitor 2 and the first inductor 3 are so determined that the loci of the impedance within the pass band falling in a small range can be shifted to the center of the Smith chart (FIG. 21C).

In this way, impedance matching for the surface acoustic wave device 1 is achieved by adjusting the input-side capacitor 2, the first inductor 3, the output-side capacitor 4, and the second inductor 5 and, at the same time, a resonance frequency can be formed outside the pass band to increase the amount of out-of-pass band attenuation.

In the surface acoustic wave device 1 shown in FIG. 2, it is preferable that the reference potential terminal 18 linked to electrode fingers at that side of the IDT electrodes 14, 15, and 16 which is not connected to the input signal pad 12a of the IDT electrode 15 and the reference potential electrode terminal 19 linked to electrode fingers at that side of the IDT electrodes 14 and 16 which is not connected to the output signal pad 13a are so formed as to be electrically separated from each other on the piezoelectric substrate 20 or within the wiring board for mounting of the piezoelectric substrate 20 from the standpoint of rendering the out-of-pass band attenuation property of the SAW filter a high attenuation characteristic. In Example 1, on the piezoelectric substrate 20 and within the wiring board for mounting of the piezoelectric substrate 20, the reference potential terminals are designed in an electrically separated configuration. The same holds true for constructing the following Examples 2, 3, and 4 and Comparative Example.

Figure 14:
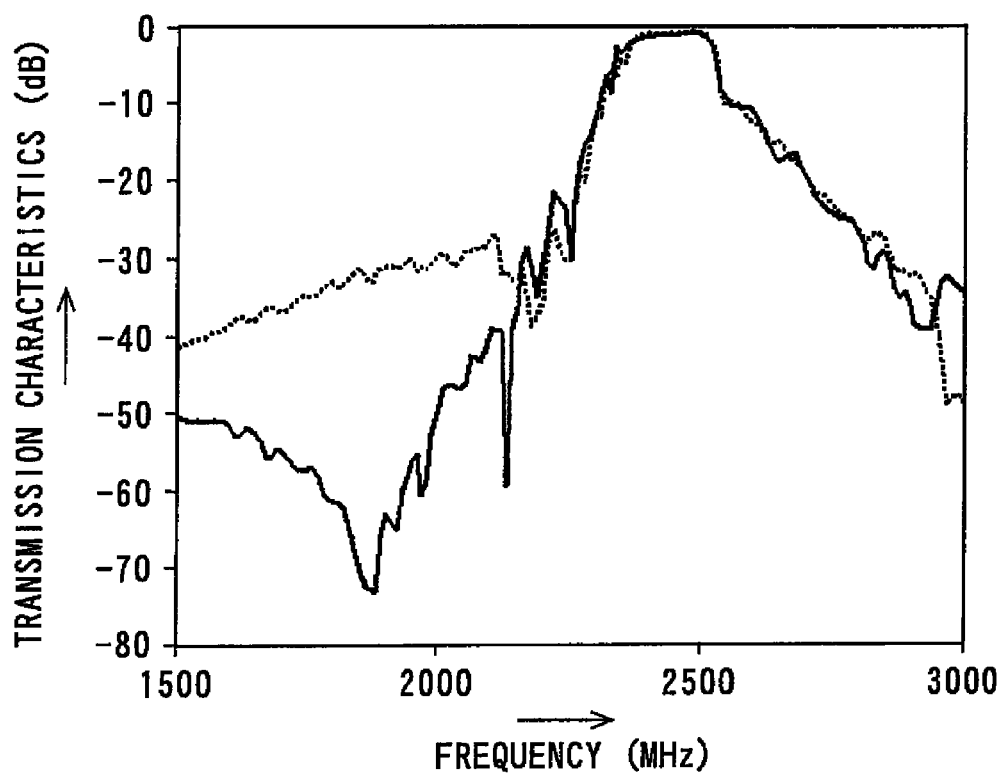
FIG. 14 is a graph showing the frequency-transmission characteristic relationship in the vicinity of a pass band obtained with the filters of Example 1 and Comparative Example 1.

In FIG. 14, there is illustrated a graph showing the frequency-transmission characteristic relationship in the pass band and its vicinity obtained with the filters of Example 1 and Comparative Example 1. FIG. 14 is a graph showing the dependence of a transmission characteristic indicative of signal transmission property of the SAW filter on frequency. A solid line represents the filter characteristics of the filter 50a of Example 1 and a broken line represents the filter characteristics of the filter 20b of Comparative Example 1. Where the out-of-pass band attenuation of the filter 50a of Example 1 is concerned, the resonance frequency of the series resonance circuit portion 11 formed of the output-side capacitor 4 and the second inductor 5 is adjusted to approximately 1900 MHz. In this way, as compared with the filter 20 of Comparative Example 1, the filter 50 of Example 1 succeeds in increasing the amount of attenuation outside the band while maintaining a wide-range, low-loss pass band.

Example 2

By way of Example 2, a filter 50a having a circuit configuration as shown in FIG. 7 was fabricated with use of a surface acoustic wave device 1 having an electrode configuration as shown in FIG. 2. The electrical characteristics of each of the filters of Example 2 and Comparative Example 1 were obtained by running computer simulation. The filters range in operating frequency from 1500 MHz to 3000 MHz.

In Example 2, the input-side capacitor 2 is set in capacitance at 4.5 pF, the output-side capacitor 4 is set in capacitance at 1.5 pF, the first inductor 3 is set in inductance at 2.3 nH, and the second inductor 5 is set in inductance at 4.2 nH. Moreover, in Comparative Example 1, the input-side capacitor 35 and the output-side capacitor 37 are each set in capacitance at 4.0 pF, and the first inductor 36 and the second inductor 38 are each set in inductance at 1.6 nH.

Figure 15:
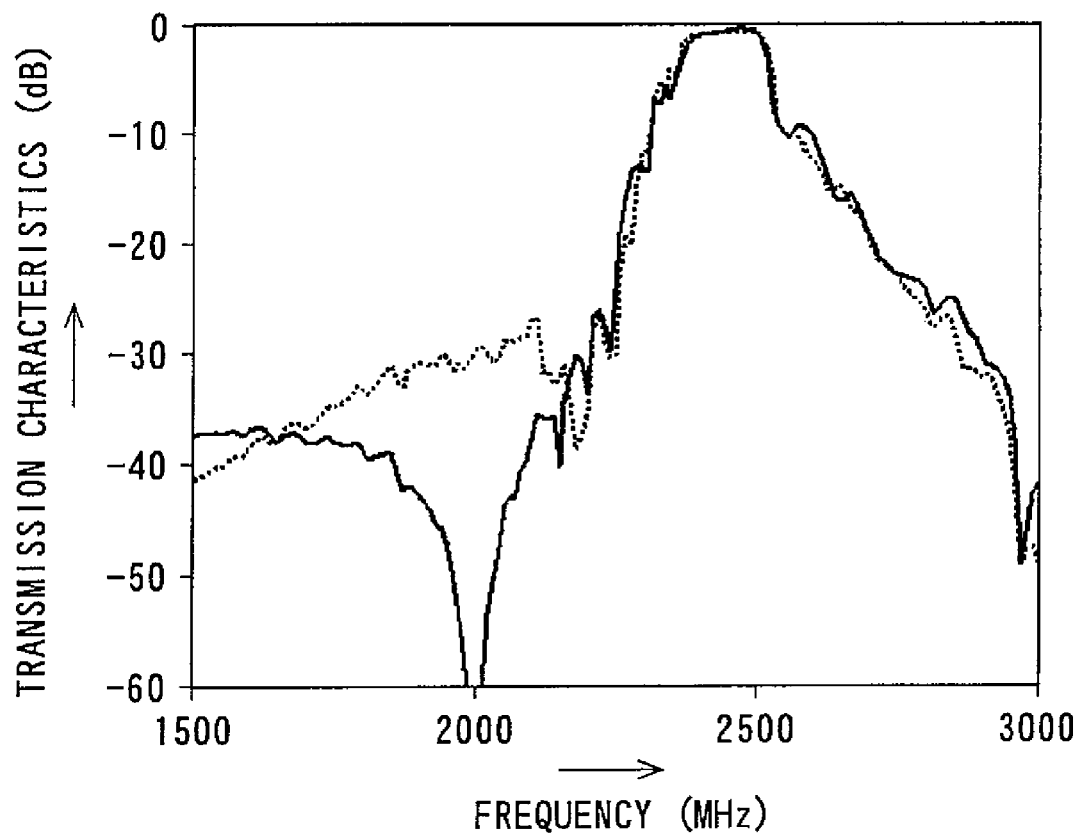
FIG. 15 is a graph showing the frequency-transmission characteristic relationship in the vicinity of pass band obtained with the filters of Example 2 and Comparative Example 1.

In FIG. 15, there is illustrated a graph showing the frequency-transmission characteristic relationship in the pass band and its vicinity obtained with the filters of Example 2 and Comparative Example 1. A solid line represents the filter characteristics of the filter 50a of Example 2 and a broken line represents the filter characteristics of the filter 20b of Comparative Example 1. In the filter 50a of Example 2, the resonance frequency of the internal series resonance circuit portion 11 formed of the output-side capacitor 4 and the second inductor 5 is adjusted to approximately 2000 MHz. In this way, as compared with the filter 20b of Comparative Example 1, the filter 50a of Example 2 succeeds in increasing the amount of attenuation outside the band while maintaining a wide-range, low-loss pass band.

Examples 3 and 4

By way of Example 3, a filter 50b having a circuit configuration as shown in FIG. 8 was fabricated with use of a surface acoustic wave device 1 having an electrode configuration as shown in FIG. 9. Moreover, by way of Example 4, a filter 50a having a circuit configuration as shown in FIG. 3 was fabricated with use of a surface acoustic wave device 1 having an electrode configuration as shown in FIG. 2. The electrical characteristics of each of the filters of Examples 3 and 4 were obtained by running computer simulation. The filters range in operating frequency from 1500 MHz to 3000 MHz.

In Example 3, the input-side capacitor (the surface acoustic wave resonator 30) is set in capacitance at 4.3 pF, the output-side capacitor (the surface acoustic wave resonator 31) is set in capacitance at 1.7 pF, the first inductor 3 is set in inductance at 3.2 nH, and the second inductor 5 is set in inductance at 3.7 nH. Moreover, in Example 4, the input-side capacitor 2 is set in capacitance at 4.3 pF, the output-side capacitor 4 is set in capacitance at 1.7 pF, the first inductor 3 is set in inductance at 3.5 nH, and the second inductor 5 is set in inductance at 4.1 nH.

In Examples 3 and 4, the first inductor 3 and the second inductor 5 are connected to the first reference potential terminal 25a and the second reference potential terminal 25b, respectively, that are arranged so as to be laterally spaced by the centerline 34 shown in FIG. 10B.

Figure 16:
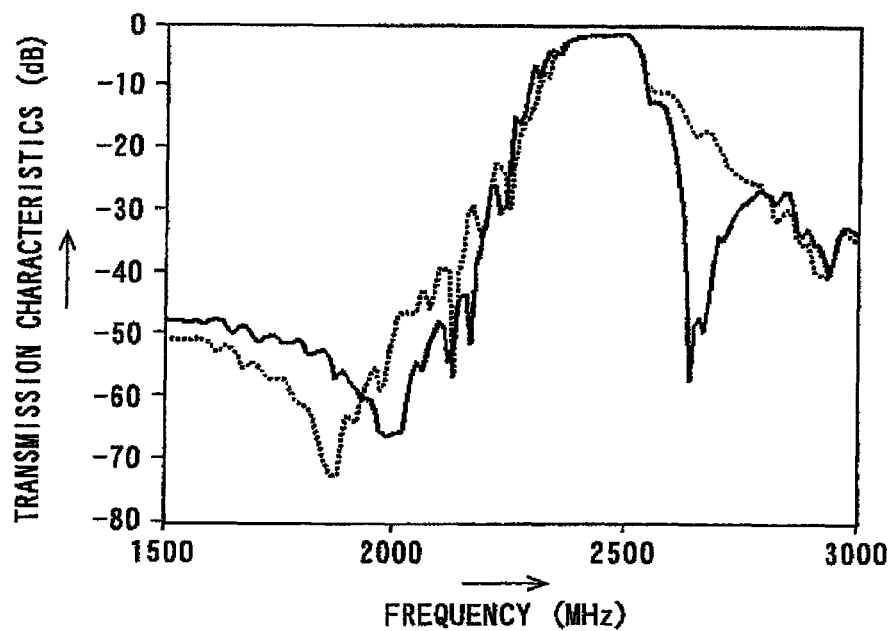
FIG. 16 is a graph showing the frequency-transmission characteristic relationship in the vicinity of the pass band obtained with the filters of Examples 3 and 4.
Figure 17:
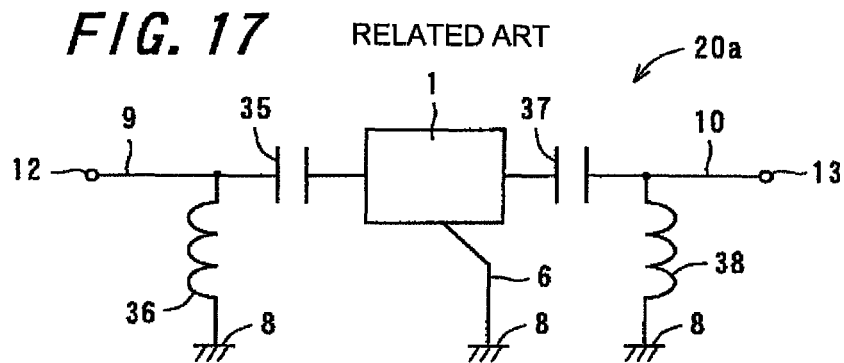
FIG. 17 is an example of a circuit diagram on a SAW filter of conventional design.
Figure 18:
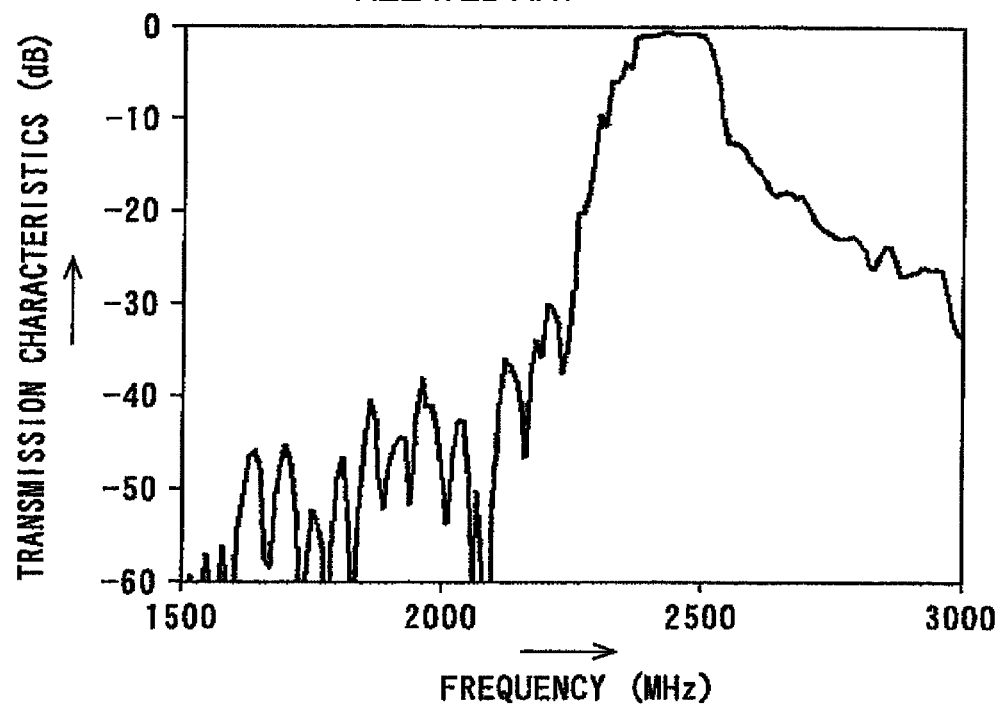
FIG. 18 is a graph showing the frequency-transmission characteristic relationship in the vicinity of the pass band obtained with the SAW filter shown in FIG. 17.

In FIG. 16, there is illustrated a graph showing the frequency-transmission characteristic relationship in the vicinity of the pass band obtained with the filters of Examples 3 and 4. In FIG. 16, a solid line corresponds to the filter 50b of Example 3 and a broken line corresponds to the filter 50a of Example 4. While both of Examples 3 and 4 exhibit satisfactory filter characteristics, the filter characteristics of the filter 50b is particularly excellent. In the filter 50b of Example 3, the resonance frequency of the series resonance circuit portion 11 formed of the output-side capacitor 4 and the second inductor 5 is adjusted to approximately 2000 MHz, and the resonance frequency of the surface acoustic wave resonator 30 is adjusted to approximately 2650 MHz. In this way, the filter 50b of Example 3 succeeds in providing a noticeable improvement in out-of-band attenuation not only at the lower-frequency side but also at the higher-frequency side while maintaining a wide-range, low-loss pass band.

It is to be understood that the application of the invention is not limited to the specific embodiments described heretofore and the invention may thus be carried into effect in various forms. For example, although the aforestated embodiments deal with the case where a surface acoustic wave device is used as an acoustic wave device, a piezoelectric thin-film resonator constructed by inserting a piezoelectric thin film between excitation electrodes may be used as an acoustic wave device.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:
1. A filter comprising:
an acoustic wave device;
a wiring board configured to mount the acoustic wave device thereon, comprising
an input signal terminal electrically connected to the acoustic wave device via a first signal line;
an output signal terminal electrically connected to the acoustic wave device via a second signal line;

a first inductor comprising one end connected to the first signal line and the other end connected to ground via a parasitic inductance; and a series resonance circuit comprising an output-side capacitor and a second inductor connected in series with the output-side capacitor, the series resonance circuit comprising one end connected to the second signal line and the other end connected to ground via the parasitic inductance;

a first reference potential terminal, wherein the first reference potential terminal is electrically connected to the first inductor and is on a lower surface of the wiring board, the first reference potential terminal separating from a periphery of the wiring board; and a second reference potential terminal, wherein the second reference potential terminal is electrically connected to the second inductor and is on the lower surface of the wiring board, the second reference potential terminal being arranged apart from the first reference potential terminal, the second reference potential terminal separating from the periphery of the wiring board.

2. The filter of claim 1, further comprising an input-side capacitor which is on the first signal line and connects in series with the acoustic wave device.

3. The filter of claim 2,
wherein the acoustic wave device comprises a plurality of IDT electrodes being formed on a piezoelectric substrate and being arranged along a propagation direction in which a surface acoustic wave propagates on the piezoelectric substrate, and
wherein at least one of the input-side capacitor and the output-side capacitor is constructed of a surface acoustic wave resonator formed on the piezoelectric substrate.

4. The filter of claim 1, wherein the input signal terminal and the output signal terminal are each an unbalanced signal terminal.

5. The filter of claim 1,
wherein the output-side capacitor is constructed of a capacitor conductor formed on the wiring board, and
each of the first inductor and the second inductor is constructed of an inductor formed on the wiring board.

6. The filter of claim 1,
wherein the first reference potential terminal and the second reference potential terminal are arranged in line-symmetrical relation with respect to a centerline of the lower surface of the wiring board each other.

7. A communications apparatus comprising:
at least one of a receiving circuit and a transmitting circuit which has the filter of claim 1.

8. The filter of claim 1, wherein a resonance frequency of the series resonance circuit falls outside a pass band.

9. A filter comprising:
an acoustic wave device comprising
a plurality of IDT electrodes being arranged along a propagation direction in which a surface acoustic wave propagates on a piezoelectric substrate;
a reflector electrode formed on the piezoelectric substrate and disposed on both sides of a whole of the plurality of IDT electrodes;
a first reference potential pad connected to one of the plurality of IDT electrodes; and
a second reference potential pad connected to another one of the plurality of IDT electrodes, the another IDT electrode being different from the IDT electrode connected to the first reference potential pad;

a wiring board configured to mount the acoustic wave device thereon, comprising
an input signal terminal electrically connected to the acoustic wave device via a first signal line;
an output signal terminal electrically connected to the acoustic wave device via a second signal line;
a first inductor comprising one end connected to the first signal line and the other end connected to ground via a parasitic inductance; and
a series resonance circuit comprising an output-side capacitor and a second inductor connected in series with the output-side capacitor, the series resonance circuit comprising one end connected to the second signal line and the other end connected to ground via the parasitic inductance;
a first reference potential terminal which is electrically connected to the first inductor and is on a lower surface of the wiring board; and
a second reference potential terminal which is electrically connected to the second inductor and is on the lower surface of the wiring board, the second reference potential terminal being arranged apart from the first reference potential terminal,
the first reference potential pad and the second reference potential pad being electrically separated from each other on the piezoelectric substrate and within the wiring board.

10. A filter comprising:
an acoustic wave device;
a wiring board configured to mount the acoustic wave device thereon, comprising
an input signal terminal electrically connected to the acoustic wave device via a first signal line;
an output signal terminal electrically connected to the acoustic wave device via a second signal line;
a first inductor comprising one end connected to the first signal line and the other end connected to ground via a parasitic inductance; and
a series resonance circuit comprising an output-side capacitor and a second inductor connected in series with the output-side capacitor, the series resonance circuit comprising one end connected to the second signal line and the other end connected to ground via the parasitic inductance;
a first reference potential terminal which is electrically connected to the first inductor and is on a lower surface of the wiring board; and
a second reference potential terminal which is electrically connected to the second inductor and is on the lower surface of the wiring board, the second reference potential terminal being arranged apart from the first reference potential terminal,
the wiring board having a rectangular lower surface, the first reference potential terminal being arranged along a first side of the lower surface of the wiring board, and the second reference potential terminal being arranged along a second side opposite to the first side of the lower surface of the wiring board, and
a connecting portion between the first inductor and the first reference potential terminal and a connecting portion between the second inductor and the second reference potential terminal being located on a diagonal line of the lower surface of the wiring board.

* * * * *